United States Patent [19]

Whiting et al.

[11] Patent Number: 5,506,580
[45] Date of Patent: * Apr. 9, 1996

[54] DATA COMPRESSION APPARATUS AND METHOD

[75] Inventors: Douglas L. Whiting, South Pasadena; Glen A. George; Glen E. Ivey, both of Pasadena, all of Calif.

[73] Assignee: Stac Electronics, Inc., San Diego, Calif.

[*] Notice: The portion of the term of this patent subsequent to Mar. 26, 2008, has been disclaimed.

[21] Appl. No.: 350,389

[22] Filed: Dec. 6, 1994

Related U.S. Application Data

[63] Continuation of Ser. No. 8,450, Jan. 21, 1993, which is a continuation of Ser. No. 992,822, Dec. 16, 1992, which is a continuation of Ser. No. 870,554, Apr. 17, 1992, which is a continuation of Ser. No. 619,291, Nov. 27, 1990, Pat. No. 5,146,221, which is a division of Ser. No. 297,152, Jan. 13, 1989, Pat. No. 5,016,009.

[51] Int. Cl.⁶ .................................................. H03M 7/30
[52] U.S. Cl. ................................. 341/51; 341/67; 341/106
[58] Field of Search .................................. 341/50, 51, 67, 341/106

[56] References Cited

U.S. PATENT DOCUMENTS

| | | |
|---|---|---|
| 3,054,987 | 9/1962 | Lawrence et al. . |
| 3,344,406 | 9/1967 | Vinal . |
| 3,390,380 | 6/1968 | Cooke-Yarborough et al. . |
| 3,394,352 | 7/1968 | Wernikoff et al. . |
| 3,396,352 | 8/1968 | Wilson . |
| 3,612,660 | 10/1971 | Miller . |
| 3,656,178 | 4/1972 | De Maine et al. . |

(List continued on next page.)

FOREIGN PATENT DOCUMENTS

| | | |
|---|---|---|
| 719774 | 10/1965 | Canada . |
| 811316 | 4/1969 | Canada . |
| 2625527 | 3/1978 | Germany . |
| 1190609 | 5/1970 | United Kingdom . |
| 1289015 | 9/1972 | United Kingdom . |
| 1318114 | 5/1973 | United Kingdom . |
| 1336317 | 11/1973 | United Kingdom . |

OTHER PUBLICATIONS

English translation of German Patent No. 26 25 527.

Berkovich, S. et al., "Matching String Patterns in Large Textual Files," Department of Electrical Engineering and computer Science, George Washington Univ., pp. 122–127, 1985.

Boyer, R., "A Fast String Searching Algorithm"; Communications of the ACM 20(10), 762–772, 1977.

Cleary, J. , "Compact Hash Tables Using Bidirectional Linear Probing"; IEEE Transactions on Computers c–33(9): 828–834, 1984.

(List continued on next page.)

*Primary Examiner*—Marc S. Hoff
*Attorney, Agent, or Firm*—Irell & Manella

[57] ABSTRACT

An apparatus and method are disclosed for converting an input data character stream into a variable length encoded data stream in a data compression system. The data compression system includes a history array. The history array has a plurality of entries and each entry of the history array is for storing a portion of the input data stream. The method for converting the input data character stream includes the following steps. Performing a search in a history array for the longest data string which matches the input data string. If the matching data string is found within the history buffer, the next step includes encoding the longest matching data string found by appending to the encoded data stream a tag indicating the longest matching data string was found and a string substitution code. If the matching data string is not found within the history array, the next step includes encoding the first character of the input data string by appending to the encoded data stream a raw data tag indicating that no matching data string was found and the first character of the input data string.

14 Claims, 8 Drawing Sheets

U.S. PATENT DOCUMENTS

| | | |
|---|---|---|
| 3,675,211 | 7/1972 | Raviv . |
| 3,675,212 | 7/1972 | Raviv et al. . |
| 3,694,813 | 9/1972 | Loh et al. . |
| 3,701,108 | 10/1972 | Loh et al. . |
| 3,717,851 | 2/1973 | Cocke et al. . |
| 3,726,993 | 4/1973 | Lavallee . |
| 3,767,901 | 10/1973 | Black et al. . |
| 3,873,977 | 3/1975 | McIntosh . |
| 3,970,183 | 7/1976 | Robinson et al. . |
| 3,976,844 | 8/1976 | Betz . |
| 3,995,254 | 11/1976 | Rosenbaum ............ 340/146.3 WD |
| 4,021,782 | 5/1977 | Hoerning . |
| 4,031,515 | 6/1977 | Kashio . |
| 4,034,350 | 7/1977 | Kashio . |
| 4,054,951 | 10/1977 | Jackson et al. . |
| 4,064,489 | 12/1977 | Babb . |
| 4,121,259 | 10/1978 | Preuss et al. . |
| 4,135,214 | 1/1979 | Weber . |
| 4,145,686 | 3/1979 | McMurray et al. . |
| 4,207,599 | 6/1980 | Murayama et al. . |
| 4,232,375 | 11/1980 | Paugstat et al. . |
| 4,290,105 | 9/1981 | Cichelli et al. . |
| 4,295,124 | 10/1981 | Roybal . |
| 4,319,225 | 3/1982 | Klose . |
| 4,376,933 | 3/1983 | Saran et al. . |
| 4,382,286 | 5/1983 | Mitchell et al. . |
| 4,386,416 | 5/1983 | Giltner et al. . |
| 4,412,306 | 10/1983 | Moll . |
| 4,464,650 | 8/1984 | Eastman et al. . |
| 4,486,853 | 12/1984 | Parsons . |
| 4,491,934 | 1/1985 | Heinz . |
| 4,494,150 | 1/1985 | Brickman et al. ................ 358/260 |
| 4,494,151 | 1/1985 | Liao . |
| 4,506,325 | 3/1985 | Bennett et al. . |
| 4,507,752 | 3/1985 | McKenna et al. . |
| 4,516,246 | 5/1985 | Kenemuth . |
| 4,543,612 | 9/1985 | Matsunaga et al. . |
| 4,545,032 | 10/1985 | Mak . |
| 4,546,342 | 10/1985 | Weaver et al. . |
| 4,558,302 | 12/1985 | Welch . |
| 4,597,057 | 6/1986 | Snow . |
| 4,610,027 | 9/1986 | Anderson et al. . |
| 4,612,532 | 9/1986 | Bacon et al. . |
| 4,626,824 | 12/1986 | Larson . |
| 4,626,829 | 12/1986 | Hauck . |
| 4,684,923 | 8/1987 | Koga . |
| 4,701,108 | 10/1987 | Scampini . |
| 4,701,745 | 10/1987 | Waterworth . |
| 4,706,264 | 11/1987 | Cung . |
| 4,730,348 | 3/1988 | MacCrisken . |
| 4,749,983 | 6/1988 | Langdon, Jr. . |
| 4,774,500 | 9/1988 | Lichty . |
| 4,783,841 | 11/1988 | Crayson . |
| 4,796,003 | 1/1989 | Bentley et al. . |
| 4,814,746 | 3/1989 | Miller et al. . |
| 4,839,649 | 6/1989 | Imai et al. . |
| 4,847,619 | 7/1989 | Kato et al. . |
| 4,857,993 | 8/1989 | Music et al. . |
| 4,862,167 | 8/1989 | Copeland, III . |
| 4,866,440 | 9/1989 | Tsukiyama et al. . |
| 4,870,415 | 9/1989 | Van Maren et al. . |
| 4,870,479 | 9/1989 | Dubner . |
| 4,872,009 | 10/1989 | Tsukiyama et al. . |
| 4,876,541 | 10/1989 | Storer . |
| 4,881,075 | 11/1989 | Weng . |
| 4,882,754 | 11/1989 | Weaver et al. . |
| 4,891,643 | 1/1990 | Mitchell et al. . |
| 4,899,147 | 2/1990 | Schiavo et al. . |
| 4,906,991 | 3/1990 | Fiala et al. . |
| 4,910,751 | 3/1990 | Einarsson . |
| 5,058,144 | 10/1991 | Fiala et al. ...................... 341/79 |

OTHER PUBLICATIONS

Collmeyer, A. et al., "Analysis of Retrieval Performance for Selected File Organization Techniques," Proc. Fall Joint Comp. Conf., pp. 201–210, 1970.

Comer, D., "English Dictionary Searching with Little Extra Space," National Computer conference, pp. 209–216, 1979.

Comer, D. et al. "Hash–Bucket Search: A Fast Technique for Searching an English Spelling Dictionary," Software—Practice and Experience, vol. 12, pp. 669–682, 1982.

Cowan, R. et al. "Hashing—the Key to Rapid Pattern Matching," Proceedings, Eurosam, lecture Notes in Computer Science 72, Springer–Verlag, Marsaille, pp. 266–278, 1979.

Davidson, G., "Rapidly Searching for Character String Matches Using Hash Coding," IBM Technical Disclosure Bulletin, vol. 16, No. 1, p. 64, 1973.

Davisson, L. et al., "Efficient Universal Noiseless Source Codes," IEEE Transactions on Information Theory, vol. IT–27, No. 3, pp. 269–279, 1981.

Dewan, H. et al., "Dat Compression by Textual Substitution Some Implementation Schemes and Results," Technical Report CS–83–113, Brandeis Unviersity, 1983.

Dimsdale, J. et al., "File Structure for an On–Line Catalog of One Million titles," Journal of library Automation, vol. 6, No. 1, pp. 37–55, 1973.

Ellzey, R., "Data Structures for Computer Information Systems," Science Research Associates, 1982.

Fiala, E. et al. "Data Compression with Finite Windows," Communications of the ACM 32(4): 490–505, Apr., 1989.

Floyd, R., "Application of Data Compression Techniques on Computer–Based Text and Program Source Libraries," Thesis, College of Engineering, Florida Atlantic University, 1977.

Floyd, R., "Data Base Compression through Combined Software Techniques," IBM Technical Disclosure Bulletin, vol. 21, No. 2, pp. 458–462, 1978.

Gallant, J., "Optimal String Compression" EECS Department, Princeton Univ., pp. 1–10. (no date).

Goble, C., "A Free–text Retrieval System using Hash Codes," The Computer Journal, vol. 18, pp. 18–20, 1975.

Goto, E. et al., "Studies on Hashing Part–2: Algorithms and Programming with CAMs," Journal of Information Processing, vol. 3, No. 1, pp. 13–22, 1980.

Harrison, M., "Implementation of the Substring Test by Hashing," Communications of the ACM 14(12): 777–779, 1971.

Heaps, H., "Data Compression of Large Document Data Bases," Journal of Chemical Information and Computer Sciences, vol. 15, No. 1, pp. 32–39, 1975.

Heaps, H., "Information Retrieval: Computational and Theoretical Aspects," Academic Press, Introduction, Chapter 5 and Chapter 9, 1978.

Hegazy, "Searching Large Textual Files for Near Matching Patterns," The George Washington Univ., 1985.

Hopgood, "Compiling Techniques," American Elsevier Publishing Company, Inc., pp. 1–28, 1969.

Horowitz and Sahni, "Fundamentals of Data Structures in Pascal," (2d ed.) 1987.

Horowitz and Sahni, "Fundamentals of Data Structures in Pascal," (4th ed.) W. H. Freeman and Company, pp. 425–457, 1990.

Karp, R. et al., "Efficient Randomized Pattern–Matching Algorithms," Harvard Univ. Center for Research in Computing Technology, pp. 1–39, 1981.

Knuth, D., "Algorithms," Scientific American, Apr., 1977, p. 63 et. seq.

Kohonen, T., "Content Addressable Memories," Spring Series in Information Sciences, vol. 1, pp. 1–124 and 253–263, 1980.

Kohonen, T. et al., "A Very Fast Associative Method for the Recognition and Correction of Misspelt Words, Based on Redundant Hash Addressing," Proc. 4th Int. Joint Conf. on Pattern Recognition, Kyoto, pp. 807–809, 1978.

Kohonen, T. et al., "A Thousand-Word Recognition System Based on the Learning Subspace Method and Redundant Hash Addressing," Proc. 5th Int. Conf. on Pattern Recognition, Miami, pp. 158–165, 1980.

Lindsay, R. et al., "Universal Data Compression," International Telemetering Conference Proceedings, pp. 117–124, 1985.

Lynch, M., "Creation of Bibliographic Search Codes for Hash-addressing Using the Variety-Generator Method," Program, vol. 9, No. 2, pp. 46–55, 1975.

Miller, V. et al., "Variations on a Theme by Lempel and Ziv," IBM, 1982.

Munakata, S., "Ziv-Lempel Data Compression Algorithm," J. Information Processing Society of Japan, vol. 27, No. 1, pp. 2–6, Jan., 1985 (with translation).

Rabin, M., "Discovering Repetitions in Strings," Combinatorial Algorithms on Words, Apostolico and Galil eds. nato ASI Series, vol. F12, pp. 279–288, 1985 (presented in Italy, Jun., 1984).

Reghbati, H. et al., "An Overview of Data Compression Techniques," Computer, vol. 14, No. 4, pp. 71–75, 1981.

Reuhkala, E., "Recognition of Strings of Discrete Symbols with Special Application to Isolated Word Recognition," ACTA Polytechnica Scandinavica Mathematics and Computer Science Series No. 38, pp. 1–92, 1983.

Reukhala, E., "Pattern Recognition for Strings of Discrete Symbols," Proc. 6th Int. Conf. on Pattern Recognition, Munich, pp. 969–972, 1982.

Rivest, R., "Partial-Match Retrieval Algorithms," Siam J. Computing, vol. 5, No. 1, p. 19 et seq., 1976.

Rodeh, M., "String Matching Algorithms and their Application to Data Compression," Thesis, Israel Institute of Technology, pp. i–40, 1976 (and translation).

Rodeh, M. et al., "A Linear Algorithm for Finding Repetitions and its Applications in Data Compression," Technicon—Israel Institute of Technology, Department of Computer Science, Haifa, Technical Report No. 72, pp. 1–32, 1976.

Ryan, D. et al., "Data Compression Experiments Using Sliding Dictionaries," Technical Report CS–84–117, Brandeis University, 1984.

Schuegraf, E., "A Survey of Data Compression Methods for Non-Numeric Records," Canadian Journal of Information Science, vol. 2, No. 1, pp. 93–105, 1977.

Schuegraf, E. et al., "A Comparison of Algorithms for Data Base Compression by Use of Fragments as Language Elements," ISR vol. 10, No. 9/10–B, pp. 309–319, 1974.

Sedgewick, R., "Algorithms" Addison–Wesley, 1984.

Severance, D., "Identifier Search Mechnisms: A Survey and Generalized Model," Computing Surveys, vol. 6, No. 3, pp. 175–194, 1974.

Stoter, J. et al., "The Macro Model for Data Compression," 1977.

Tharp, A. et al., "The Practicality of Text Signatures for Accelerating String Searching," Software—Practice and Experience, vol. 12, pp. 35–44, 1982.

Wagner, R., "Common Phrases and Minimum–Space Text Storage," Communications of the ACM 16(3): 148–152, 1973.

Waterworth Design Memo, "Some Notes on the Subject of File Compression, Issue 2." (Jun. 1983).

Waterwoth source code. (Jun. 1983).

Whiting, D., "Bit–Serial Reed–Solomon Decoders in VLSI," Thesis, California Institute of Technology, 1985.

Willett, P., "Document Retrieval Experiments Using Indexing Vocabularies of Varying Size. 11. Hashing, Truncation, Diagram and Trigram Enconding of Index Terms," Journal of Documentation, vol. 35, No. 4, pp. 296–305, 1979.

Wipke, W. et al., "Hash Functions for Rapid Storage and Retrieval of Chemical Structures," J. Chem., Inf. comput. Sci. vol. 18, No. 1, pp. 32–37, 1978.

Wirth, "Algorithms+Data Structures=Programs," 1976.

Zamora, A., "Automatic Detection and Correction of Spelling Errors in a Large Data Base,: Journal of the American Society for information Science", pp. 51–57, 1980.

Aho, Hopcroft and Ullman, *The Design and Analysis of Computer Algorithms*, pp. 111–113, 145–147 (1974).

P. A. Alsberg, "Space and time Savings Through Large Data Base Compression and Dynamic Restructuring", *Proceedings of the IEEE*, vol. 63, No. 8, pp. 1114–1122, Aug., 1975.

A. Apostolico and E. Guerrieri, "Linear Time Universal Compression Techniques For Dithered Images Based on Pattern Matching," (extended abstract), *Proceedings Twenty-First Allerton Conference on Communications, Control, and Computing*, Monticello, Illinois, pp. 70–79 (1975).

Augenstein and Tenenbaum, *Data Structures and PL/I Programming*, pp. 534–542 (1979).

M. F. Barnsley and A. D. Sloan, "A Better Way to Compress Images," *Byte*, Jan., 1988, pp. 215–223.

J. L. Bentley, D. D. Sleator, R. E. Tarjan, and V. K. Wei, "A Locally Adaptive Data Compression Scheme," *Communications of the ACM*, vol. 29, No. 4, Apr., 1986, pp. 320–330.

J. G. Cleary and I. H. Witten, "Data Compression Using Adaptive Coding and Partial String Matching," *IEEE Transactions On Communications*, vol. 33, No. 4, Apr., 1984, pp. 396–403.

M. Cohn, "Performance of Lempel–Ziv Compressors with Deferred Innovation," Brandeis University, Technical Report TR–88–132, Apr., 1988.

D. Cooper and M. F. Lynch, "Text Compression Using Variable to Fixed–Length Encodings," *Journal of the American Society for Information Science*, Jan., 1982, pp. 18–31.

G. V. Cormack, "Data Compression On A Data Base System," *Communications of the ACM*, vol. 28, No. 12, Dec., 1985, pp. 1336–1342.D. L. Dance and U. W. Pooch, "An Adaptive On Line Data Compression System," *The Computer Journal*, vol. 19, No. 3, Aug., 1976, pp. 216–224.

L. D. Davisson and R. M. Gray, "Advances in Data Compression," *Advances in Communication Systems Theory and Applications*, vol. 4, pp. 199–228 (1975).

S. Even and M. Rodeh, "Economical Encoding of Commas Between Strings," *Communications of the ACM*, vol. 21, No. 4, Apr., 1978, pp. 315–317.

N. Faller, "An Adaptive System for Data Compression," *Conference Record of the Seventh IEEE Asilomar Conference on Circuits and Systems*, pp. 593–597 (1973).

A. S. Fraenkel and S. T. Klein, "Novel Compression of Sparse Bit–Strings—Preliminary Report," *Combinatorial Algorithms on Words*, pp. 169–183, (1985).

A. S. Fraenkel, M. Mor and Y. Perl, "Is Text Compression by Prefixes and Suffixes Practical?", *Acta Informatica*, vol. 20, pp. 371–389 (1983).

W. D. Frazer, "Compression Parsing Of Computer File Data," *First USA–Japan Computer Conference*, pp. 609–615 (1972).

H. Fujiwara and K. Kinoshita, "On Testing Schemes for Test Data Compression," *Transactions of the IECE of Japan*, vol. E 61, No. 6, Jun., 1978, p. 504.

J. Gallant, D. Maier, and J. A. Storer, "On Finding Minimal Length Superstrings," *Journal of Computer and Systems Sciences*, vol. 20, pp. 50–58 (1980).

A. Gamal and A. Orlitsky, "Interactive Data Compression," *Proceedings of the Twenty–Fifth Annual Symposium on Foundations of Computer Science*, Oct. 24–26, 1984, pp. 100–108.

A. V. Goldberg, "Compression and Ranking," *Proceeding of the Seventeenth Annual ACM Symposium on Theory of Computing*, May 6–8, 1985, pp. 440–448.

S. W. Golomb, "Run–Length Encodings," *IEEE Transactions on Information Theory*, vol. 12, Jul., 1966, pp. 399–401.

M. E. Gonzalez Smith and J. A. Storer, "Parallel Algorithms for Data Compression," *Journal of the Association for Computing Machinery*, vol. 32, No. 2, Apr., 1985, pp. 344–373.

D. Gottlieb, S. A. Haberth, P. G. H. Lehot and H. S. Rabinowitz, "A Classification of Compression Methods and their Usefulness for a Large Data Processing Center," *National Computer Conference*, 1975, pp. 453–458.

L. J. Guibas, "Periodicities in Strings," *Combinatorial Algorithms on Words*, pp. 257–269 (1985).

B. Hahn, "A New Technique for Compression and Storage of Data," *Communications of the ACM*, vol. 17, No. 8, Aug., 1974, pp. 434–436.

A. Hartman and M. Rodeh, "Optimal Parsing of Strings," *Combinatorial Algorithms on Words*, pp. 155–167 (1985).

G. Held, *Data Compression: Techniques and Applications, Hardware and Software Considerations*, (second edition 1987).

R. N. Horspool and G. V. Cormack, "A General–Purpose Data Compression Technique with Practical Computer Applications," *Proceedings of the CIPS*, Session 84, pp. 138–141 (1984).

D. A. Huffman, "A Method for the Construction of Minimum–Redundancy Codes," *Proceedings of the I.R.E.*, Sep., 1952, pp. 1098–1101.

D. W. Jones, "Application of Splay Trees To Data Compression," *Communications of the ACM*, vol. 31, No. 8, Aug., 1988, pp. 996–1007.

D. E. Knuth, "Dynamic Huffman Coding," *Journal of Algorithms*, vol. 6, pp. 163–180 (1985).

Knuth, *Sorting and Search: The Art of Computer Programming*, pp. 506–549 (vol. 3, 1973).

D. E. Knuth, J. H. Morris, and V. R. Pratt, "Fast Pattern Matching in Strings," *Siam Journal of Computing*, vol. 6, No. 2, Jun., 1977, pp. 323–350.

G. G. Langdon, Jr., "A Note on the Ziv–Lempel Model for Compressing Individual Sequences," *IEEE Transactions on Information Theory*, vol. IT–29, No. 2, Mar., 1983, pp. 284–287.

L. L. Larmore, "Length Limited Coding and Optimal Height–Limited Binary Trees," University of California, Irvine, Technical Report 88–01, Jan., 1988.

D. A. Lelewer and D. S. Hirschberg, "Data Compression," *ACM Computing Surveys*, vol. 19, No. 3, Sep. 1987, pp. 261–296.

A. Lempel, G. Seroussi and J. Ziv, "On the Power of Straight–line Computations in Finite Fields," *IEEE Transactions on Information Theory*, vol. IT–28, No. 6, Nov., 1982, pp. 875–880.

A. Lempel and J. Ziv, "On the Complexity of Finite Sequences," *IEEE Transactions on Information Theory*, vol. IT–22, No. 1, Jan., 1976, pp. 75–81.

A. Lempel and J. Ziv, "Compression of Two–Dimensional Data," *IEEE Transactions on Information Theory*, vol. IT–32, No. 1, Jan., 1986, pp. 2–8.

A. Lempel and J. Ziv, "Compression of Two–Dimensional Images," *Combinatorial Algorithms on Words*, pp. 141–154 (1985).

J. A. Llewellyn, "Data Compression for a Source with Markov Characteristics," *The Computer Journal*, vol. 30, No. 2, pp. 149–156 (1987).

B. A. Marron and P. A. D. De Maine, "Automatic Data Compression," *Communications of the ACM*, vol. 10, No. 11, Nov., 1967, pp. 711–715.

A. Mayne and E. B. James, "Information Compression by Factorising Common Strings," *The Computer Journal*, vol. 18, No. 2, May, 1975, pp. 157–160.

J. P. McCarthy, "Automatic File Compression," *International Computing Symposium 1973*, pp. 511–516.

E. M. McCreight, "A Space–Economical Suffix Tree Construction Algorithm," *Journal of the Association for Computing Machinery*, vol. 23, No. 1, Apr., 1976, pp. 262–272.

V. S. Miller and M. N. Wegman, "Variations on a Theme by Lempel and Ziv," *Combinatorial Algorithms on Words*, pp. 131–140 (1985).

J. H. Mommens and J. Raviv, "Coding for Data Compaction," *IBM Watson Res. Report RC5150*, Nov. 1974.

J. Pike, "Text Compression Using a 4–Bit Coding Scheme," *The Computer Journal, vol. 24, No. 4, pp. 324–330 (1981)*.

J. H. Reif and J. A. Storer, "Real–Time Dynamic Compression of Video on a Grid–Connected Parallel Computer," *Third International Conference on Supercomputing*, May 15–20, 1988, pp. 453–462.

J. Rissanen, "A Universal Data Compression System," *IEEE Transactions on Information Theory*, vol. IT–29, No. 5, Sep., 1983, pp. 656–664.

M. Rodeh, V. R. Pratt, and S. Even, "Linear Algorithms for Data Compresion via String Matching," *Journal of the Association for Computing Machinery*, vol. 28, No. 1, Jan., 1981, pp. 16–24.

I. Rubin, "Data Compression for Communication Networks: The Delay–Distortion Function," *IEEE Transactions on Information Theory*, vol. IT–22, No. 6, Nov., 1977, pp. 655–665.

D. G. Severance, "A Practitioner's Guide to Data Base Compression," *Information Systems*, vol. 8, No. 1, pp. 51–62 (1983).

J. A. Storer, "Parallel Algorithms For On–Line Dynamic Data Compression," *IEEE International Conference on Communications 1988*, pp. 385–389.

J. A. Storer, "Textual Substitution Techniques for Data Compression," *Combinatorial Algorithms on Words*, pp. 111–129 (1985).

J. A. Storer and T. G. Szymanski, "Data Compression via Textual Substitution," *Journal of the Association for Computing Machinery*, vol. 29, No. 4, Oct., 1982, pp. 928–951.

J. A. Storer and T. G. Szymanski, "The Macro Model for Data Compression," (extended abstract), *Tenth Annual ACM Symposium on Theory of Computing*, pp. 30–39 (1978).

B. Varn, "Optimal Variable Length Codes (Arbitrary Symbol Cost and Equal Code Work Probability)," *Information and Control*, vol. 19, pp. 289–301 (1971).

U. Vishkin, "Optimal Parallel Pattern Matching in Strings," (extended summary), *Lecture Notes in Computer Science*, pp. 497–508 (1985).

P. Winer, "Liner Pattern Matching Algorithms," *Fourteenth Annual Symposium on Switching & Automata Theory*, Oct. 15–17, 1973, pp. 1–11.

T. A. Welch, "A Technique for High–Performance Data Compression," *IEEE Computer*, Jun., 1984, pp. 8–19.

M. Wells, "File Compression Using Variable Length Encodings," *The Computer Journal*, vol. 15, No. 4, Nov., 1972, pp. 308–313.

J. Ziv, "Coding Theorems for Individual Sequences," *IEEE Transactions on Information Theory*, vol. IT–24, No. 6, Jul., 1978, pp. 405–412.

J. Ziv, "On Universal Quantization," *IEEE Transactions on Information Theory*, vol. IT–31, No. 3, May, 1985, pp. 344–347.

J. Ziv and A. Lempel, "A Universal Algorithm for Sequential Data Compression," *IEEE Transactions on Information Theory*, vol. IT–23, No. 3, May, 1977, pp. 337–343.

J. Ziv and A. Lempel, "Compression of Individual Sequences Via Variable–Rate Coding," *IEEE Transactions on Information Theory*, vol. IT–24, No. 5, Sep., 1978, pp. 530–536.

J. K. Gallant, "String Compression Algorithms," Ph.D. Dissertation, Department of Electrical Engineering and Computer Science, Princeton University, 1982.

J. A. Storer, *Data Compression: Methods and Theory* (1988).

J. A. Storer, "Data Compression: Method and Complexity Issues," Ph.D. Dissertation, Department of Electrical Engineering and Computer Science, Princeton University, 1979.

Alfred V. Aho, John E. Hopcroft, Jeffrey D. Ullman, *Data Structures and Algorithms*, 1983, pp. 122–125.

Jules Aronson, "Data Compression—A Comparison of Methods," *Computer Science & Technology*, National Bureau of Standards Special Publication 500–12, Jun. 1977.

R. B. Arps, T. K. Truong, D. J. Lu, R. C. Pasco, T. D. Friedman, "A Multi–Purpose VLSI Chip For Adaptive Data Compression of Bilevel Images," *IBM Journal of Research and Development*, vol. 32, No. 6, Nov. 1988, pp. 775–795.

Michael F. Barnsley and Alan D. Sloan, "A Better Way to Compress Images," *Byte*, Jan. 1988, pp. 215–223.

Timothy C. Bell, "Better OPM/L Text Compression," *IEEE Transactions On Communications*, vol. Com–34, No. 12, Dec. 1986, pp. 1176–1182.

Timothy Bell, "A Unifying Theory and Improvements for Existing Approaches to Text Compression," Ph.D. Thesis, Department of Computer Science, University of Canterbury, 1986.

Timothy C. Bell, John G. Cleary, Ian H. Witten, *Text Compression*, 1990, pp. 23, 103–104.

T. Bell and A. Moffat, "A Note on the DMC Data Compression Scheme," *The Computer Jorunal*, vol. 32, No. 1, 1989, pp. 16–20.

Timothy Bell and Ian H. Witten, "Greedy Macro Text Compression," Research Report No. 87/285/33, Dec. 1987, Department of Computer Science, The University of Calgary.

Timothy C. Bell, Ian H. Witten and John G. Cleary, "Modeling for Text Compression," Research Report No. 88/327/39, Oct. 1988, Department of Computer Science, The University of Calgary.

Jon Bentley, "Software Exploratorium—The Big Squeeze," *Unix Review*, vol. 9, No. 6, pp. 77–82. (No Date).

R. P. Brent, "A Linear Algorithm for Data Compression," *The Australian Computer Journal*, vol. 19, No. 2, May 1987, pp. 64–68.

Peter Camana, "Video–bandwidth compression: a study in tradeoffs," *IEEE Spectrum*, Jun. 1979, pp. 24–29.

G. V. Cormack and R. N. S. Horspoll, "Data Compression Using Dynamic Markov Modelling," *The Computer Journal*, vol. 30, No. 6, 1987, pp. 541–550.

Thomas M. Cover, "Hypothesis Testing With Finite Statistics," *The Annals of Mathematical Statistics*, vol. 40, No. 3, 1969, pp. 828–835.

Maxime Crochemore and Dominique Perrin, "Two–Way String–Matching," *Journal of the Association for Computing Machinery*, vol. 38, No. 3, Jul. 1991, pp. 651–675.

C. Ekambaram and S. C. Kwatra, "A New Architecture For Adaptive Transform Compression of NTSC Composite Video Signal," *IEEE*, 1981, C9.6.1–C9.6.5.

Peter Elias, "Distinguishable Codeword Sets for Shared Memory," *IEEE Transactions on Information Theory*, vol. IT–21, No. 4, Jul. 1975, pp. 392–399.

Peter Elias, "Efficient Storage and Retrieval by Content and Address of Static Files," *Journal of the Association of Computing Machinery*, vol. 21, No. 2, Apr. 1974, pp. 246–260.

Peter Elias, "Universal Codeword Sets and Representations of the Integers," *IEEE Transactions on Information Theory*, vol. IT– 21, No. 2, Mar. 1975, pp. 194–203.

R. J. Enbody, H. C. Du, "Dynamic Hashing Schemes," *ACM Computing Surveys*, vol. 20, No. 2, Jun. 1988, pp. 85–113.

Ronald Fagin, Jurg Nievergelt, Nicholas Pippenger and H. Raymond Strong, "Extendible Hashing—A Fast Access Method for Dynamic Files," *ACM Transactions on Database Systems*, vol. 4, No. 3, Sep. 1979, pp. 315–344.

Robert M. Fano, "The Transmission of Information," Technical Report No. 65, Mar. 17, 1949, Research Laboratory of Electronics, Massachusetts Institute of Technology.

R. M. Fano, "The Transmission of Information–II," *Technical Report No. 149, Feb. 6, 1950, Research Laboratory of Electronics, Massachusetts Institute of Technology*.

Nicola J. Fedele, Alfonse A. Acampora, Richard M. Bunting, "Real–time multi–directional data compression of full motion video," *SPIE vol. 901 Image Processing, Analysis, Measurement, and Quality*, (1988), pp. 82–90.

Philippe Flajolet, "Approximate Counting: A Detailed Analysis," *BIT 25*, (1985), pp. 113–134.

Robert G. Gallager, "Variations on a Theme by Huffman," *IEEE Transactions on Information Theory*, vol. IT–24, No. 6, Nov. 1978, pp. 668–674.

E. N. Gilbert, E. F. Moore, "Variable–length binary encodings," *The Bell Telephone System Technical Journal*, vol. 38, pp. 933–968, Jul. 1959.

Neill Graham, *Introduction to Computer Science*, 3rd Edition, 1985, p. 219.

Donald J. Healy, O. Robert Mitchell, "Digital Video Bandwidth Compression Using Block Truncation Coding," *IEEE Transactions On Communications*, vol. COM–29, No. 12, Dec. 1981, pp. 1809–1817.

Daniel R. Helman, Glen G. Langdon, Jr., "Data Compression—Translating data from a useful form to an economical one," *IEEE Potentials*, Feb. 1988, pp. 25–28.

D. Helman and G. G. Langdon, Jr., "Dynamic Replacement Hashing Algorithm for Dictionaries," *IBM Technical Dis-

*closure Bulletin,* vol. 29, No. 8, Jan. 1987, pp. 3274–3275.

D. R. Helman, G. G. Langdon, Jr., N. Martin and S. J. P. Todd, "Statistics Collection for Compression Coding wtih Randomizing Feature," *IBM Technical Disclosure Bulletin,* vol. 24, No. 10, Mar. 1982, p. 4917.

D. R. Helman, G. G. Langdon, Jr. and J. J. Rissanen, "Arithmetic Compression Code Control Parameter Approximation," *IBM Technical Disclosure Bulletin,* vol. 23, No. 11, Apr. 1981, pp. 5112–5114.

Martin E. Hellman and Thomas M. Cover, "On Memory Saved by Randomization," *the Annals of Mathematical Statistics,* 1971, vol. 42, No. 3, pp. 1075–1078.

R. Nigel Horspool, Gordon V. Cormack, Technical Correspondence, *Communications of the ACM,* vol. 29, No. 2, Feb. 1986, pp. 150–152.

Merle E. Houdek, Glen R. Mitchell, "Hash index helps manage large virtual memory," *Electronics,* Mar. 15, 1979, pp. 111–114.

Intel, "Hardware Reference Information," *The 8086 Family User's Manual,* Oct. 1979, pp. 4–18–4–20.

Intel, *iAPX 286 Programmer's Reference Manual,* 1983, pp. 2–15–2–22, B–1–B–5.

Matti Jakobsson, "Compression of Character Strings by an Adaptive Dictionary," *BIT,* 1985, pp. 593–603.

Roger Emanuel Kaufman, *A Fortran Coloring Book,* The M.I.T. Press, 1978, pp. 74–75.

Tsutomu Kawabata and Hirosuke Yamamoto, "A New Implementation of the Ziv–Lempel Incremental Parsing Algorithm," *IEEE Transactions on Information Theory,* vol. 37, No. 5, Sep. 1991, pp. 1439–1440.

Brian W. Kernighan, Dennis M. Ritchie, *The C Programming Language,* Prentice–Hall, Inc., 1978, pp. 20, 119–127, 134–136.

Glen G. Langdon, Jr., "An Introduction to Arithmetic Coding," *IBM Journal of Research and Development,* vol. 28, No. 2, Mar. 1984, pp. 135–149.

G. G. Landon, Jr., "Method for Carry–over Control in a FIFO Arithmetic Code String," *IBM Technical Disclosure Bulletin,* vol. 23, No. 1, Jun. 1980, pp. 310–312.

Glen G. Langdon, Jr., "A Note on the Ziv–Lempel Model for Compressing Individual Sequences," *Computer Science Research Report,* Nov. 24, 1981, IBM Research Division.

Glen G. Langdon, Jr., "Tutorial on Arithmetic Coding," *Computer Science Research Report,* May 6, 1981, IBM Research Division.

G. G. Langdon, Jr., J. J. Rissanen, "Arithmetic Coding with Integer Code Word Lengths," *Research Report,* IBM Research Division. (No Date available).

Glen G. Langdon, Jr., Jorma J. Rissanen, "Compression of Black–White Images with Binary Arithmetic Coding," *Communications Research Report,* Dec. 6, 1979, IBM Research Division.

Glen G. Langdon, Jr. and Jorma Rissanen, "Compression of Black–White Images with Arithmetic Coding," *IEEE Transactions on Communications,* vol. COM–29, No. 6, Jun. 1981, pp. 858–867.

Glen G. Langdon, Jr., Jorma J. Rissanen, "A Double–Adaptive File Compression Algorithm," *IEEE Transactions on Communications, vol. COM–31, No. 11, Nov. 1983, pp. 1253–1256.*

Per–Åke Larson, "Dynamic Hash Tables," *Communications of the ACM,* Apr. 1988, vol. 31, No. 4, pp. 446–457.

Ted G. Lewis, Curtis R. Cook, "Hashing for Dynamic and Static Internal Tables," *Computer,* Oct. 1988, pp. 45–56.

Arch C. Luther, "You are there . . . and in control," *IEEE Spectrum,* Sep. 1988, pp. 45–50.

E. Mäkinsen, "On Implementing two Adaptive Data–compression Schemes," *The Computer Journal,* vol. 32, No. 3, 1989, pp. 238–240.

G. Nigel N. Martin, Glen G. Langdon, Jr., Stephen J. P. Todd, "Arithmetic Codes for Constrained Channels," *Computer Science Research Report,* Jan. 21, 1982, IBM Research Division.

Edward M. McCreight, "A Space–Economical Suffix Tree Construction Algorithm," *Journal of the Association for Computing Machinery,* vol. 23, No. 2, Apr. 1976, pp. 262–272.

Victor S. Miller, Mark N. Wegman, "Variations on a theme by Ziv and Lempel," *Computer Science Research Report,* Jul. 31, 1984, IBM Research Div.

J. L. Mitchell, W. B. Pennebaker, "Optimal hardware and software arithmetic coding procedures for the Q–Coder," *IBM Journal of Research and Development,* vol. 32, No. 6, Nov. 1988, pp. 727–736.

J. L. Mitchell, W. B. Pennebaker, "Software implementations of the Q–Coder," *IBM Journal of Research and Development,* vol. 32, No. 6, Nov. 1988, pp. 753–774.

Robert C. Nickerson, *Fundamentals of Fortran 77 Programming—A Structured Approach,* 3rd Edition, 1985, pp. 128–139.

J. Nievergelt, E. M. Reingold, "Binary Search Trees of Bounded Balance," *Siam J. Comput.,* vol. 2, No. 1, Mar. 1973, pp. 33–43.

W. B. Pennebaker, J. L. Mitchell, G. G. Langdon, Jr., R. B. Arps, "An Overview of the basic principles of the Q–Coder adaptive binary arithmetic coder," *IBM Journal of Research and Development,* vol. 32, No. 6, Nov. 1988, pp. 717–726.

W. B. Pennebaker, J. L. Mitchell, "Probability estimation for the Q–Coder," *IBM Journal of Research and Development,* vol. 32, No. 6, Nov. 1988, pp. 737–752.

William B. Pennebaker, Joan L. Mitchell, Cesar A. Gonzales, Karen L. Anderson, "Approaching Exact Photographic Image Compression: The Last Stages," *Communications Research Report,* Apr. 24, 1987, IBM Research Division.

Peter Pirsch, Ludwig Stenger, "Statistical analysis and coding of color video signals," *Acta Electronica,* vol. 19, No. 4, 1976, pp. 277–287.

Timo Raita, Jukka Teuhola, "Predictive Text Compression by Hashing," *ACM Conf. on Information Retrieval,* New Orleans, 1987, pp. 223–233.

Majid Rabbani, *Digital Image Compression,* Photographic Research Laboratories Imaging Science Lab, Eastman Kodak Company, Jan. 1, 1988.

Majid Rabbani, Scott Daly, "An Optimized image data compression technique utilized in the Kodak SV9600 still video transceiver," *SPIE,* Jan. 1989.

Jorma Rissanen, "Arithmetic Codings as Number Representations," Reprint from *Acta Polytechnica Scandinavica,* Ma 31, Helsinki 1979, pp. 44–51.

Jorma Rissanen, "Probability Estimation for Symbols—Observed or Not," *Computer Science Research Report,* Jan. 27, 1983, IBM Research Division.

Jorma Rissanen, "Universal Coding, Information, Prediction, and Estimation," *IEEE Transactions on Information Theory,* vol. IT–30, No. 4, Jul. 1984, pp. 629–636.

J. Rissanen, "A Universal Data Compression System," *Computer Science Research Report,* Jun. 24, 1983, IBM Research Division.

Jorma Rissanen, "A Universal Data Compression System," *IEEE Transactions on Information Theory,* vol. IT–29, No.

5, Sep. 1983, pp. 656–664.

J. Rissanen, G. G. Langdon, Jr., "Arithmetic Coding," *IBM Journal of Research and Development*, vol. 23, No. 2, Mar. 1979, pp. 149–162.

Jorma Rissanen, Glen G. Langdon, Jr., "Universal Modeling and Coding," *IEEE Transactions on Information Theory*, vol. IT–27, No. 1, Jan. 1981, pp. 12–23.

Ronald L. Rivest, "Optimal Arrangement of Keys in a Hash Table," *Journal of the Association of Computing Machinery*, vol. 25, No. 2, Apr. 1978, pp. 200–209.

Charles S. Stein, Andrew B. Watson, Lewis E. Hitchnert, "Psychophysical rating of image compression techniques," *SPIE*, Jan. 1989, pp. 1–11.

Quentin F. Stout, Bette L. Warren, "Tree Rebalancing in Optimal Time and Space," *Communications of the ACM*, vol. 29, No. 9, Sep. 1986, pp. 902–908.

Stephen Todd, G. G. Langdon, Jr., Dan Helman, Nigel Martin, "Dynamic Statistics Collection for Compression Coding with Randomizing Feature," *Research Report*, Aug. 31, 1988, IBM Research Division.

Stephen J. P. Todd, Glen G. Langdon, Jr., G. Nigel N. Martin, "A General Fixed–Rate Arithmetic Coding Method for Constrained Channels," *Computer Science Research Report*, Jan. 21, 1982, IBM Research Division.

Jeffrey Scott Vitter, "Design and Analysis of Dynamic Huffman Coding" (extended abstract), *IEEE*, 1985, pp. 293–302.

Jeffrey Scott Vitter, "Design and Analysis of Dynamic Huffman Coding," Technical Report No. CS–85–13, Jul. 1985, Department of Computer Science, Brown University, pp. 1–30.

Ross N. Williams, "Dynamic–History Predictive Compression," *Inform. Systems*, vol. 13, No. 1, pp. 129–140, 1988.

Ian H. Witten, Timothy C. Bell, "Source Models for Natural Language," Research Report No. 88/326/38, Oct. 1988, Department of Computer Science, The University of Calgary.

Ian H. Witten, John G. Cleary, "Inductive Modeling for Data Compression," Research Report No. 87/254/02, Jan. 1987, Department of Computer Science, The University of Calgary.

Ian H. Witten, Radford M. Neal, John G. Gleary, "Arithmetic Coding for Data Compression," *Communications of the ACM*, vol. 30, No. 6, Jun. 1987, pp. 520–540.

Ian H. Witten, Radford Neal, John G. Cleary, "Arithmetic Coding for Data Compression," Research Report No. 86/238/12, Aug. 1986, Department of Computer Science, The University of Calgary.

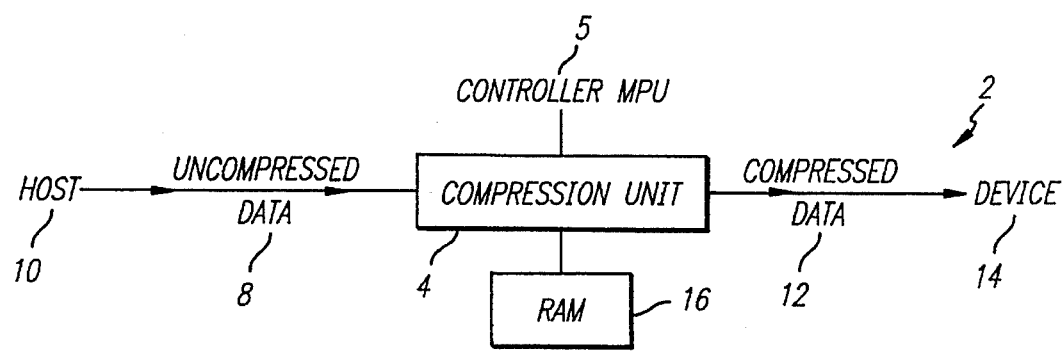
FIG. 1a
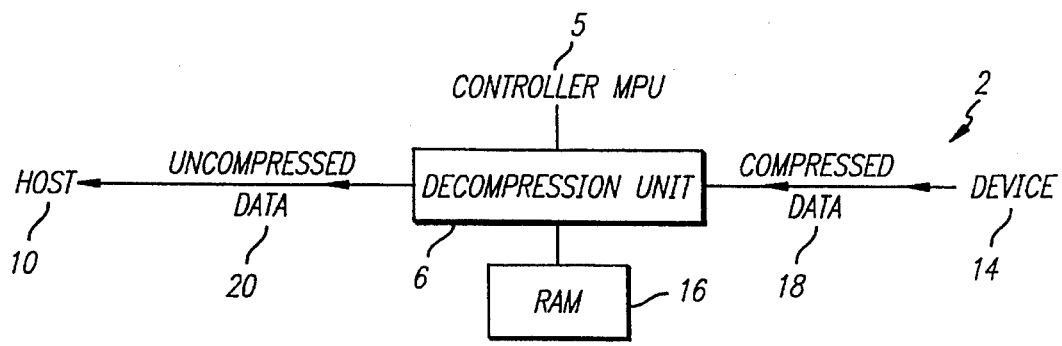
FIG. 1b
FIG. 8
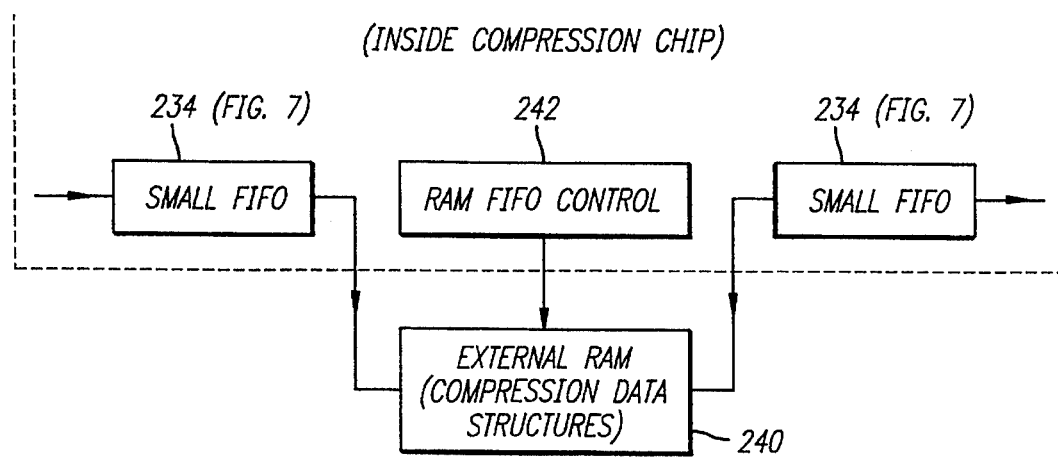

FIG. 2

19— 0bbbbbbbb = unencoded ("ra") 8-bit byte bbbbbbbb
21— 1<offset><length> = STRING AT OFFSET BACK INTO HISTORY OF GIVEN LENGTH
23— OFFSET ENCODING (# BYTES BACK INTO HISTORY FROM CURRENT POSITION):

<offset> = 1oooooooo     = 7-bit (short) offset 1..127 bytes
              0ooooooo     = 11-bit (long) offset 1..2047 bytes

25— STRING LENGTH ENCODING TABLE:

| <length> = | | | | | bytes | |
|---|---|---|---|---|---|---|
| 00 | | | | = 2 bytes | — 22 |
| 01 | | | | = 3 bytes | — 24 |
| 10 | | | | = 4 bytes | — 26 |
| 11 | 00 | | | = 5 bytes | — 28 |
| 11 | 01 | | | = 6 bytes | — 30 |
| 11 | 10 | | | = 7 bytes | — 32 |
| 11 | 11 | 0000 | | = 8 bytes | — 34 |
| 11 | 11 | 0001 | | = 9 bytes | — 36 |
| 11 | 11 | 0010 | | =10 bytes | — 38 |
| 11 | 11 | 0011 | | =11 bytes | — 40 |
| 11 | 11 | 0100 | | =12 bytes | — 42 |
| 11 | 11 | 0101 | | =13 bytes | — 44 |
| 11 | 11 | 0110 | | =14 bytes | — 46 |
| 11 | 11 | 0111 | | =15 bytes | — 48 |
| 11 | 11 | 1000 | | =16 bytes | — 50 |
| 11 | 11 | 1001 | | =17 bytes | — 52 |
| 11 | 11 | 1010 | | =18 bytes | — 54 |
| 11 | 11 | 1011 | | =19 bytes | — 56 |
| 11 | 11 | 1100 | | =20 bytes | — 58 |
| 11 | 11 | 1101 | | =21 bytes | — 60 |
| 11 | 11 | 1110 | | =22 bytes | — 62 |
| 11 | 11 | 1111 | 0000 | =23 bytes | — 64 |
| 11 | 11 | 1111 | 0001 | =24 bytes | — 66 |
| 11 | 11 | 1111 | 0010 | =25 bytes | — 68 |
| ... | | | | ... | |
| 11 | 11 | 1111 | 1110 | =37 bytes | — 70 |
| 11 | 11 | 1111 | 1111 0000 | =38 bytes | — 72 |
| 11 | 11 | 1111 | 1111 0001 | =39 bytes | — 74 |
| etc. | | | | | |

| 75 INPUT BYTE STREAM | 77 OUTPUT BIT STREAM | 79 COMMENT |
|---|---|---|
| 1--->-A | 0 aaaaaaaa | RAW BYTE A —76 |
| 1    B | 0 bbbbbbbb | RAW BYTE B —78 |
| 1  1-->A | 0 aaaaaaaa | RAW BYTE A —80 |
| 1  1-<-A | ENCODE→ 1 1 0000001 1100 | STRING OF LENGTH 5 —82 AT OFFSET 1 |
| 1    A | | |
| 1    A | | |
| 1    A | | |
| 1    A | | |
| 1    C | 0 cccccccc | RAW BYTE C —84 |
| ---->-A | 1 1 0001001 01 | STRING OF LENGTH 3 —86 AT OFFSET 9 |
| B | | |
| A | | |

In the ENCODE row: SHORT | OFFSET | LENGTH

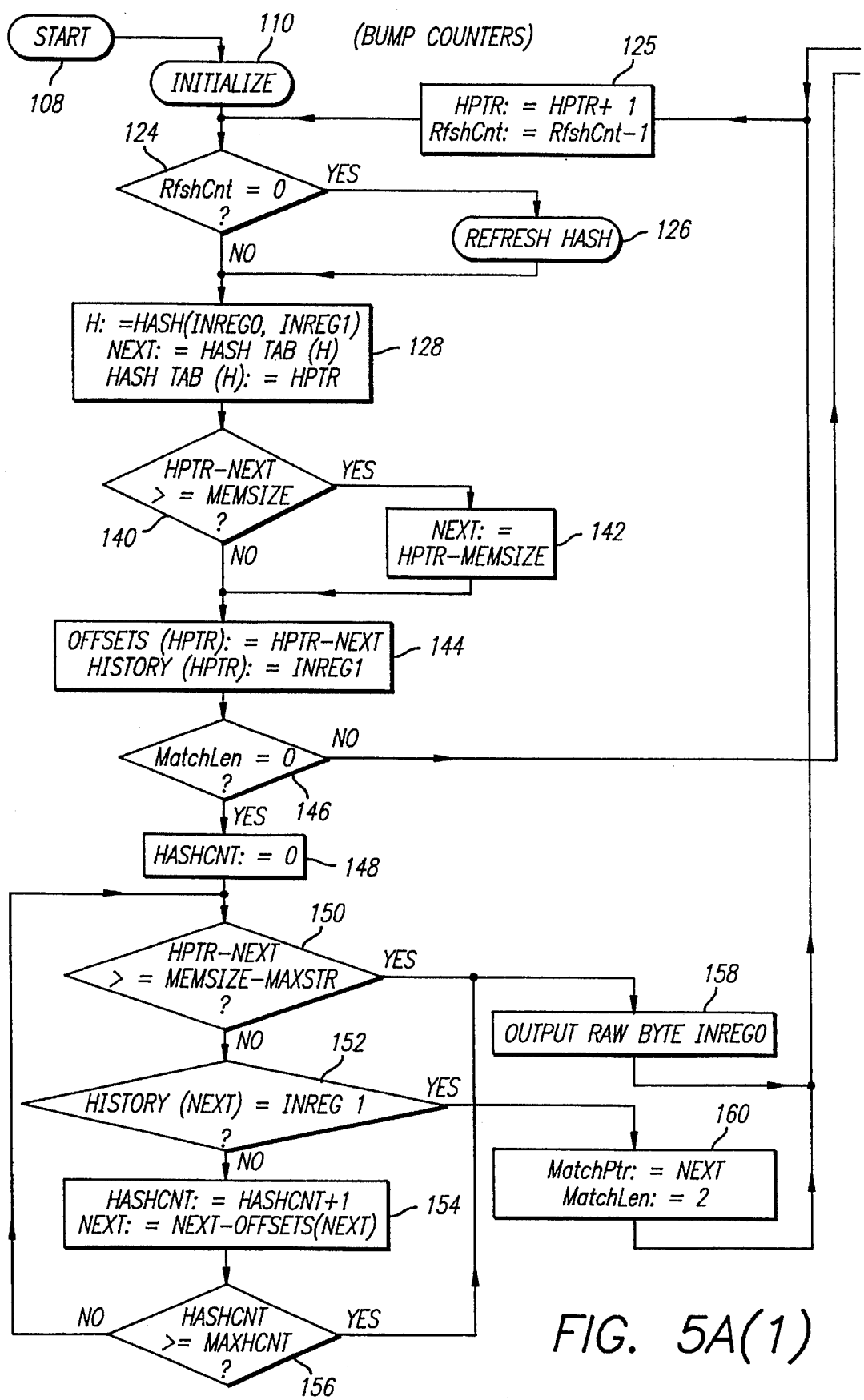
FIG. 5A(1)

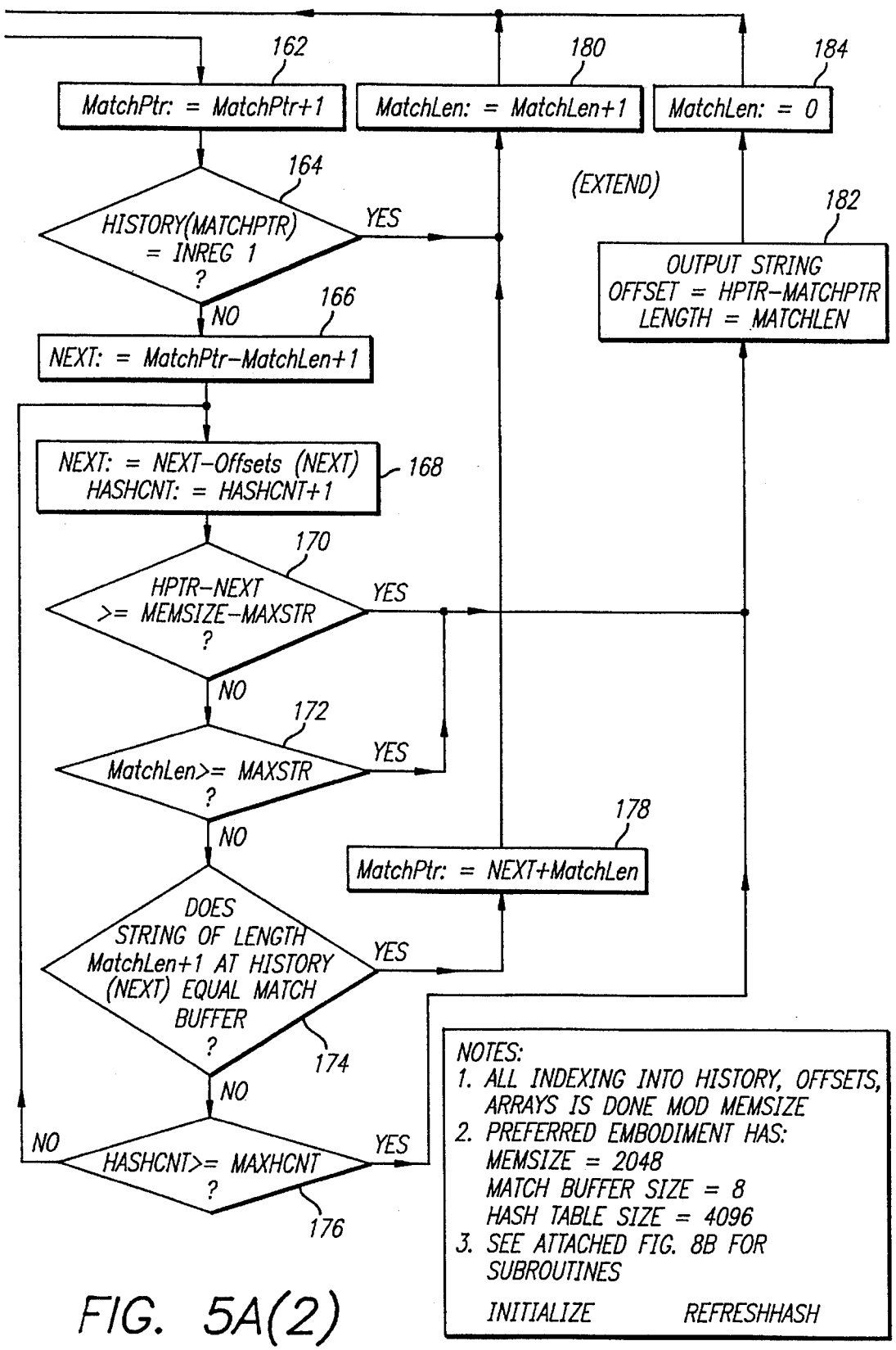
FIG. 5A(2)

DATA COMPRESSION APPARATUS AND METHOD

RELATED APPLICATIONS

This application is a continuation of copending application Ser. No. 08/008,450, filed Jan. 21, 1993, which is a continuation of Ser. No. 07/992,822, filed Dec. 16, 1992, which is a continuation of Ser. No. 07/870,554, filed Apr. 17, 1992, which is a continuation of Ser. No. 07/619,291, filed Nov. 27, 1990, now U.S. Pat. No. 5,146,221, issued Sep. 8, 1992, which is a division of Ser. No. 07/297,152, filed Jan. 13, 1989, now U.S. Pat. No. 5,016,009, issued May 14, 1991.

BACKGROUND OF THE INVENTION

1. Field of the Invention

The present invention relates generally to data storage and communication systems, and more particularly to data compression systems and methods which improve the capacity of data storage and communication.

2. Description of the Prior Art

Due to the insignificant differences between data compression in data storage and data communication systems, only data storage systems are referred to; particularly the data files stored in such systems. However, all data storage systems can easily be extended to cover data communications systems and other applications as well. A file is assumed to be a sequential stream of bytes or characters, where a byte consists of some fixed number of bits (typically 8), and the compression system transforms this input byte stream into a "compressed" output stream of bytes from which the original file contents can be reconstructed by a decompression unit.

It is well-established that computer data files typically contain a significant amount of redundancy. Many techniques have been applied over the years to "compress" these files so that they will occupy less space on the disk or tape storage medium or so that they can be transmitted in less time over a communications channel such as a 1200 baud modem line. For example, there are several widely used commercial programs available for personal computers (e.g., ARC Software by Systems Enhancement Assoicates, Inc., Wayne, N.J., 1985) which perform the compression and decompression functions on files. It is not uncommon for such programs to reduce the size of a given file by a 2:1 ratio (or better), although the amount of reduction varies widely depending on the contents of the file.

There are many approaches in the prior art for compressing data. Some of these approaches make implicit assumptions about certain types of files or data within the files. For example, a bit image of a page produced using a scanner typically has most of its pixels blank, and this tendency can be exploited by a compression algorithm to greatly reduce the size of such files. Similarly, word processing files contain many ASCII characters which are easily compressed using knowledge of which characters (or words) occur most frequently in the language of interest (e.g., English). Other compression methods are independent of the file type and attempt to "adapt" themselves to the data. In general, type-specific compression techniques may provide higher compression performance than general-purpose algorithms on the file for which the techniques are optimized, however they tend to have much lower compression performance if the file model is not correct. For instance, a compression method optimized for English text might work poorly on files containing French text.

Typically, a storage system does not "know" what type of data is stored within it. Thus, data-specific compression techniques are avoided, or they are only used as one of a set of possible techniques. For example, ARC uses many methods and picks the one that performs best for each file; note however that this approach requires significant computational overhead compared to using a single compression method.

Another important aspect of any compression method is the speed at which a file can be processed. If the speed of compression (or decompression) is so low as to significantly degrade system performance, then the compression method is unacceptable even though it may achieve higher compression ratios than competing methods. For example, with streaming tape systems, if the file cannot be compressed fast enough to provide data at the required rate for the tape drive, the tape will fall out of streaming and the performance and/or capacity gains due to compression will be nullified.

One of the most common compression techniques is known as run-length encoding. This approach takes advantage of the fact that files often have repeated strings of the same byte (character), such as zero or the space character. Such strings are encoded using an "escape" character, followed by the repeat count, followed by the character to be repeated. All other characters which do not occur in runs are encoded by placing them as "plain text" into the output stream. The escape character is chosen to be a seldom used byte, and its occurrence in the input stream is encoded as a run of length one with the escape character itself as the character. Run-length encoding performs well on certain types of files, but can have poor compression ratios if the file does not have repeated characters (or if the escape character occurs frequently in the file). Thus, the selection of the escape character in general requires an extra pass on the data to find the least used byte, lowering the throughput of such a system.

A more sophisticated approach is known as Huffman encoding (see, Huffman, David A., "A Method for the Construction of Minimum-Redundancy Codes", Proceedings of the IRE, pp. 1098–1110, September 1952). In this method, it is assumed that certain bytes occur more frequently in the file than others. For example, in English text the letter "t" or "T" is much more frequent than the letter "Q". Each byte is assigned a bit string, the length of which is inversely related to the relative frequency of that byte in the file. These bit strings are chosen to be uniquely decodeable if processed one bit at a time. Huffman derived an algorithm for optimally assigning the bit strings based on relative frequency statistics for the file.

The Huffman algorithm guarantees that asymptotically the compression achieved will approach the "entropy" of the file, which is precisely defined as, $$H = SUM - [p(i) \log 2(p(i))];$$

where p(i)=probability of character i within the file=(# occurrences of i)/(total # characters in file).
The units of H are in bits, and it measures how many bits (on the average) are required to represent a character in the file. For example, if the entropy were 4.0 bits using an 8-bit byte, a Huffman compression system could achieve 2:1 compression on the file. The higher the entropy, the more "random" (and thus less compressible) is the data.

Huffman encoding works very well on many types of files. However, assignment of bit strings to bytes presents many practical difficulties. For example, if a pre-assigned encoding scheme is used (e.g., based on frequency of occurrence of letters in English), Huffman encoding may greatly expand a file if the pre-assigned scheme assumes considerably different frequency statistics than are actually present in the file. Additionally, computing the encoding scheme based on the file contents not only requires two passes over the data as well as applying the Huffman algorithm to the frequency statistics (thus lowering system throughput), but it also requires that the encoding table be stored along with the data, which has a negative impact on the compression ratio. Furthermore, the relative frequency of bytes can easily change dynamically within the file, so that at any point the particular encoding assignment may perform poorly.

There have been many variations on the Huffman approach (e.g., Jones, Douglas W., "Application of Splay Trees to Data Compression", Communications of the ACM, pp. 996–1007, Vol. 31, No. 8, August 1988) and they usually involve dynamic code assignment based on the recent history of input bytes processed. Such schemes circumvent the problems discussed above. Other approaches include looking at two byte words (bi-grams) at the same time and performing Huffman encoding on the words.

A recent variation of Huffman encoding is present in U.S. Pat. No. 4,730,348 to MacCrisken (and other patents referenced therein). In MacCrisken, Huffman codes are assigned to bytes in the context of the previous byte. In other words, a plurality of encoding tables are used, each table being selected according to the previous byte. This approach is based on the observation that, for example, in English the letter "u" does not occur very frequently, but following a "q" it appears almost always. Thus, the code assigned to "u" would be different depending on whether or not the previous letter was "q" (or "Q"). For a similar scheme using multiple tables and dynamic code assignment see, Jones, Douglas W., "Application of Splay Trees to Data Compression".

The above described Huffman-type approaches tend to be computationally intensive and do not exceptionally achieve high compression ratios. One explanation for this observation is that a pure Huffman code based on 8-bit bytes can achieve at best an 8:1 compression ratio, and only in the optimal situation when the file consists of the same byte repeated over and over (i.e. entropy=0). In the same scenario a simple run-length encoding scheme could achieve better than a 50:1 compression ratio. The average performance will be some combination of best and worst case numbers, and limiting the best case must also limit the average. An ideal Huffman code should be able to use "fractional" bits to optimize code assignment, but the practical limitation of integral numbers of bits in each code limits the Huffman performance to well below its theoretical limit.

A totally different approach to compression was developed by Ziv and Lempel (see, Ziv, J. and Lempel, A., "Compression of Individual Sequences via Variable-Rate Coding", IEEE Transactions on Information Theory, Vol. IT-24, pp. 530–536, September 1978) and then refined by Welch (see, Welch, Terry A., "A Technique for High-Performance Data Compression", IEEE Computer, pp. 8–19, June 1984). Instead of assigning variable length codes to fixed size bytes, the Ziv-Lempel algorithm ("ZL") assigns fixed-length codes to variable size strings. As input bytes from the file are processed, a table of strings is built up, and each byte or string of bytes is compressed by outputting only the index of the string in the table. Typically this index is in the range 11–14 bits, and 12 bits is a common number because it lends itself to a simple implementation. Since the table is constructed using only previously encoded bytes, both the compression and the decompression system can maintain the same table without any extra overhead required to transmit table information. Hashing algorithms are used to find matching strings efficiently. At the start of the file, the table is initialized to one string for each character in the alphabet, thus ensuring that all bytes will be found in at least one string, even if that string only has length one.

The Ziv-Lempel algorithm is particularly attractive because it adapts itself to the data and requires no pre-assigned tables predicated on the file contents. Furthermore, since a string can be extremely long, the best case compression ratio is very high, and in practice ZL outperforms Huffman schemes on most file types. It is also quite simple to implement, and this simplicity manifests itself in high throughput rates.

There are also some drawbacks, however, to the ZL compression method. The ZL string search is a "greedy" algorithm. For example, consider the string:

ABCDEFBCDEF;

where A,B,C,D,E,F are any distinct bytes. Note that the ZL string search would add the following strings to its string table: AB, BC, CD, DE, EF, BCD, DEF, the only strings of length two or greater that can be output using this algorithm, up to the point shown, are BC and DE. In actuality the string BCDEF has already occurred in the input. Thus, while ideally the second BCDEF string would be referenced back to the original BCDEF, in practice this does not occur.

A more significant disadvantage to the ZL approach is that the string table for holding the compressed data will tend to fill up on long files. The table size could be increased, however, this approach would require more bits to represent a string and thus it would be less efficient. One approach to handling this deficiency would be to discard all or part of the table when it fills. Because of the structure of the algorithm, the most recently found strings have to be discarded first, since they refer back to previous strings. However, it is the most recent strings that have been dynamically adapting to the local data, so discarding them is also inefficient. Basically, the ZL string table has infinite length memory, so changes in the type of data within the file can cause great encoding inefficiencies if the string table is full.

It is also possible to design a compression system that utilizes more than one method simultaneously, dynamically switching back and forth depending on which method is most efficient within the file. From an implementation standpoint, such a scheme may be very costly (i.e., slow and/or expensive), however the resulting compression rate could be very high.

One such method of dynamically switching back and forth is disclosed in MacCrisken. As mentioned above, a bi-gram Huffman method is utilized as the primary compression technique. Typically the compression and decompression system start with a pre-defined (i.e. static) set of code tables. There may be a set of such tables, perhaps one each for English, French, and Pascal source code. The compression unit (sender) first transmits or stores a brief description of which table is to be used. The decompression unit (receiver) interprets this code and selects the appropriate table. During compression, if it is determined that the current table is not performing well, the sender transmits a special ("escape") Huffman code that tells the receiver to either select another specific pre-defined table or to compute a new table based on the previous data it has decompressed. Both sender and receiver compute the table using the same algorithm, so there is no need to send the entire table, although it takes some time to perform the computation.

Once the new table is computed, compression proceeds as before. It should be noted that although there is considerable computational overhead, there is no reason why this technique could not be further adapted to a dynamic Huffman scheme.

In addition to the Huffman encoding, MacCrisken used a secondary string-based compression method. Both sender and receiver maintain a history buffer of the most recently transmitted input bytes. For each new input byte (A), the bi-gram Huffman code is generated, but an attempt is also made to find the string represented by the next three input bytes (ABC) in the history using a hashing scheme. The hash is performed on three byte strings and a doubly-linked hash list is maintained to allow discarding of old entries in the hash list. If a string is found, a special Huffman escape code can be generated to indicate that a string follows, and the length and offset of the string in the history buffer is sent. The offset is encoded in 10 bits, while the length is encoded into 4 bits, representing lengths from 3–18 bytes. Before such a string is sent however, the compression unit generates the Huffman codes for all the bytes in the string and compares the size of the Huffman codes with the size of the string bits. Typically the Huffman string escape code is four bits, so it takes 19 bits to represent a string. The smaller of the two quantities is sent.

Note that the MacCrisken string method avoids the problems of the Ziv-Lempel method in that the string "table" never fills up, since the old entries are discarded by removing them from the hash list. Thus, only the most recent (within 1K bytes) strings occupy the table. Also it is not "greedy" since in principle all matching strings can be found. In practice, a limit on the length of the string search is imposed. Additionally, the MacCriskin method is computationally inefficient because it is effectively performing two compression algorithms at once, and thus the computational overhead is quite high.

SUMMARY OF THE INVENTION

The present invention is a compression/decompression system which increases the capacity of digital storage or transmission media, such as magnetic disk or tape storage devices. The compression method is fully adaptive, requiring no pre-initialized encoding tables, and is optimized for byte-oriented character streams, such as computer files. It overcomes many of the difficulties found in the prior art and generally achieves higher compression ratios than the previous techniques as discussed above.

During compression, a history buffer of previously processed bytes is maintained in the compression apparatus. Compression is achieved by locating repeated strings of bytes in the history buffer. If no matching string containing the byte currently being examined is found, the byte is appended to the output data stream after a special tag bit to indicate that the byte is "raw" (i.e., not a string). If such a string is found, its length and relative position within the history buffer are encoded and appended to the output (compressed) data stream. String length and positions are encoded in such a fashion that even two-byte repeated strings result in a compression ratio better than 1:1. In other words, only in the case of a single "raw" byte does data "expansion" occur.

The string length encoding is variable length, and the string position may also be encoded as a variable length field. Thus, the present invention maps variable length input strings to variable length output codes.

A hash table is used to perform efficient string searches, and a hash "refresh" method is utilized to minimize the computation overhead required for maintaining the hash data structures. These techniques allow for high-speed compression of the input data, at input rates up to several megabytes/second using currently available integrated circuit technology.

The following is a more detailed description of the preferred embodiment of the present invention which includes a method and apparatus for converting an input data character string into a variable length encoded data string in a data compression system. The data compression system comprises a history array means. The history array means has a plurality of entries and each entry of the history array means is for storing a portion of an input data stream. The method of the preferred embodiment comprises the following steps.

The first step includes performing a search in the history array means for the longest data string which matches the input data stream. If such a matching data string is found within the history array means, the second step includes encoding the matching data string found in the history array means by appending to the variable length encoded data stream a tag indicating that the matching data string was found and by appending a string substitution code. The string substitution code includes a variable length indicator of the length of the matching data string and a pointer to the location within the history array means of the matching data string.

If a matching input data string is not found within the history array means, the second step includes the step of encoding the first character of the input data stream by appending to the variable length encoded data stream a "raw" data tag which indicates that no matching data string was found in the history array means and the first character of the input data stream is also appended to the variable length encoded data stream. In this way, the input data stream is converted into a variable length encoded data stream.

The step of performing the search in the history array means for the longest matching data string may further include the step of limiting the search to a predetermined number of inquiries into the history array means for the longest matching data string. Additionally, the step for performing the search for the longest matching data string can also include the step of performing a hasing function.

In order to perform the hashing function, a data compression system includes certain hash data structures including a history array pointer, a hash table means and an offset array means. The history array pointer points to the latest entry in the history array means. The hash table means has a plurality of entries and each entry in the hash table means stores a pointer which points into the history array means. The offset array means has a plurality of entries, and each entry provides a link to one of the entries in the history array means. The step for performing the hash function typically includes the following steps.

First, obtaining the result of the hashing function which provides a pointer to one of the entries in the hash table means. Then, obtaining the pointer stored in the hash table entry pointed to by the result of the hash function. Next, calculating the difference between the history array pointer and the pointer read from the hash table means and storing the difference into the offset array entry pointed to by the history array pointer. Lastly, storing the history array pointer into the hash table entry pointed to by the hash function.

The preferred embodiment of the invention also includes a refresh function. The refresh function periodically examines the pointers stored in the entries of the hash table to determine whether the pointer of each entry differs from the history pointer by a predetermined amount. If the difference in the pointer and the history array pointer is greater than a predetermined amount, then the entry in the hash table is replaced by an invalid value which reinitializes the entry.

Additionally, the preferred embodiment provides an initialization routine which effectively replaces all entries of the hash table with invalid values which effectively initializes the table.

The preferred embodiment of the invention also includes a method for decoding the variable length encoded data stream which is output from the compression unit. The method for decomposition includes the following steps.

First, the variable length encoded data stream is parsed into separate portions and each separate portion starts with one of the tags. Next, the tag of each separate portion is evaluated to determine whether the tag is the raw data tag or the tag indicating an encoded matching data string. When the tag indicates that there is an encoded matching data string, the next step includes interpreting the length indicator and the pointer of the substitution code for generating the matching data string. In this way, a portion of the original input data stream is reconstructed. Alternatively, when the tag is a raw data tag, then the first character of the encoded input data stream is obtained and in this way a portion of the original input data stream is reconstructed.

BRIEF DESCRIPTION OF THE DRAWINGS

FIG. 1a is a block diagram of a compression unit accepting uncompressed data and outputting compressed data according to the present invention.

FIG. 1b is a block diagram of a decompression unit accepting compressed data and outputing decompressed data according to the present invention.

FIG. 2 depicts the compression format used by the preferred embodiment of the present invention.

FIG. 5a is a flow block diagram of the COMPRESSION OPERATION Routine performed by the compression unit (FIG. 1a) for encoding the input data stream.

FIG. 8 is a block diagram of the external RAM FIFO.

DETAILED DESCRIPTION OF THE PREFERRED EMBODIMENT

Figure 7:
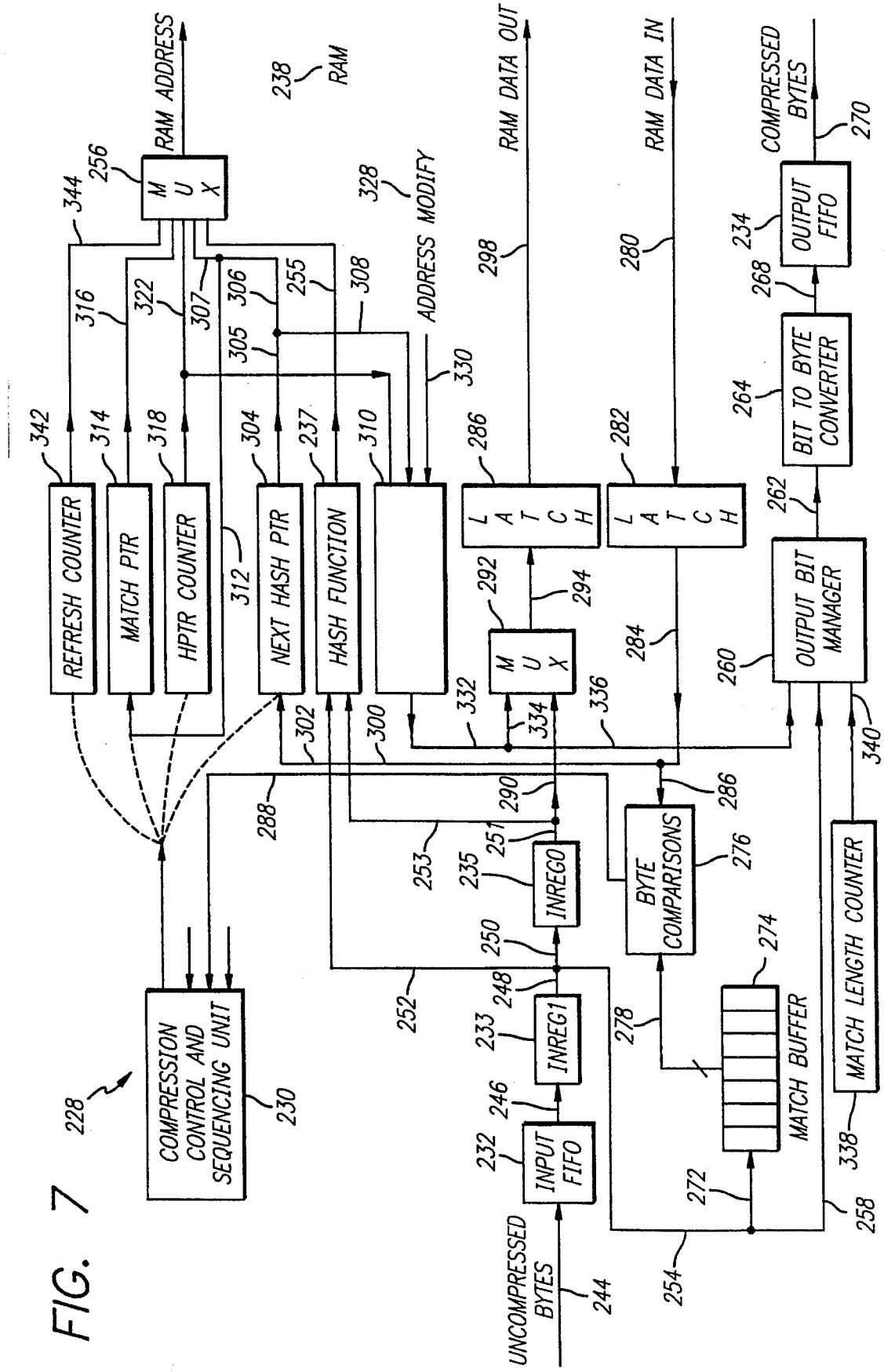
FIG. 7 is a schematic block diagram of a hardwired representation of the COMPRESSION OPERATION Routine (FIG. 5a).

Referring to FIGS. 1a and 1b a compression unit 4 and a block diagrams of a decompression unit 6 according to the present invention are depicted. Both units 4 and 6 can be hardware modules or software subroutines, but, in the preferred embodiment, the compression 4 and decompression 6 units are incorporated into a single integrated circuit (FIG. 7). The integrated circuit is used as part of a data storage or data transmission system, which is controlled by a microprocessor 5. Referring to FIG. 1a, an input data stream 8 is received by the compression unit 4 from a data source called the host 10, and the encoded compressed data stream 12 is transmitted to a data sink called the device 14.

Similarly, in FIG. 1b, the decompression unit 6 receives a compressed data stream 18 from the device 14 (which in this case is a data source), reconstructs the original uncompressed data stream 20, and outputs it to the host 10 (which in this case is a data sink). In the preferred embodiment, decompression and compression are not performed simultaneously, however in an alternate embodiment they could be performed at the same time.

All data structure (e.g. history array 102, hash table 100, and offset array 104 (FIG. 4)) are maintained in a separate external RAM chip 16. RAM 16 could be contained within the chip, but in current technology a chip containing both RAM 16 and the compression/decompression units (4 and 6) would be very expensive. RAM 16 must contain at least 16K bytes of data in the preferred embodiment, and it may be configured as 16K by 8 bits or 8K by 16 bits. The preferred embodiment can also use up to 32K bytes of RAM 16, allowing for a larger hash table (FIG. 4) which can improve performance. A more detailed explanation of the preferred data structures implemented by the preferred embodiment is discussed below during the discussion of the compression unit that builds and maintains them.

Those skilled in the art shall recognize that the values of all numeric parameters (e.g., MEMSIZE, 16-bit HPTR, etc.) discussed below can be modified without affecting the basic concept behind the compression decompression technique of the present invention.

Referring to FIG. 2, the encoding scheme of the preferred embodiment of the invention is shown. In the preferred embodiment, the method for encoding utilizes a tag bit to indicate whether an output data string is "raw" or uncompressed which is indicated by a "0" bit, 0BBBBBBBB= encoded "raw", 8-bit byte (19, FIG. 2) or compressed indicated by a "1" bit, 1(offset)(length)=string at offset back into history buffer (21, FIG. 2). In the preferred embodiment, the offset encoding or the number of bytes back into the history buffer is one of two forms (23, FIG. 2). A short form having 7 bits can create an offset of 1 to 127 bytes and a long form having 11 bits can create an offset of 1 to 2,047 bytes. The long and short offset forms are differentiated by a single bit; "1" designating short form and "0" designating long form. The particular length encoding scheme used by the present invention is shown in Table 25 (FIG. 2). From the top of the Table 25, a 2 byte length is encoded by 2 bits having the values "00" (22, FIG. 2). Likewise, encoded lengths of 3 and 4 bytes are represented respectively by 2 bits having the values "01" (24, FIG. 2) and "10" (26, FIG. 2). Byte lengths of 5 to 7 are represented by 4 bits, "11 00" to "11 10" (28–32, FIG. 2). Byte lengths of 8 to 22 are represented by 8 bits, "11 11 0000" to "11 11 1110" (34–62, FIG. 2). After 22 byte lengths, the next byte lengths between 23 and 37 are represented by 12 bits, (64–70, FIG. 2) and so on. The advantage of the length encoding scheme shown in Table 25 is for enabling an efficient procedure for encoding the length of a bit string during the compression method discussed below. Although different encoding methods have been utilized for encoding length and offset, the compression ratios obtained by the above approaches are very similar to the preferred embodiment.

Figures 3, 4:
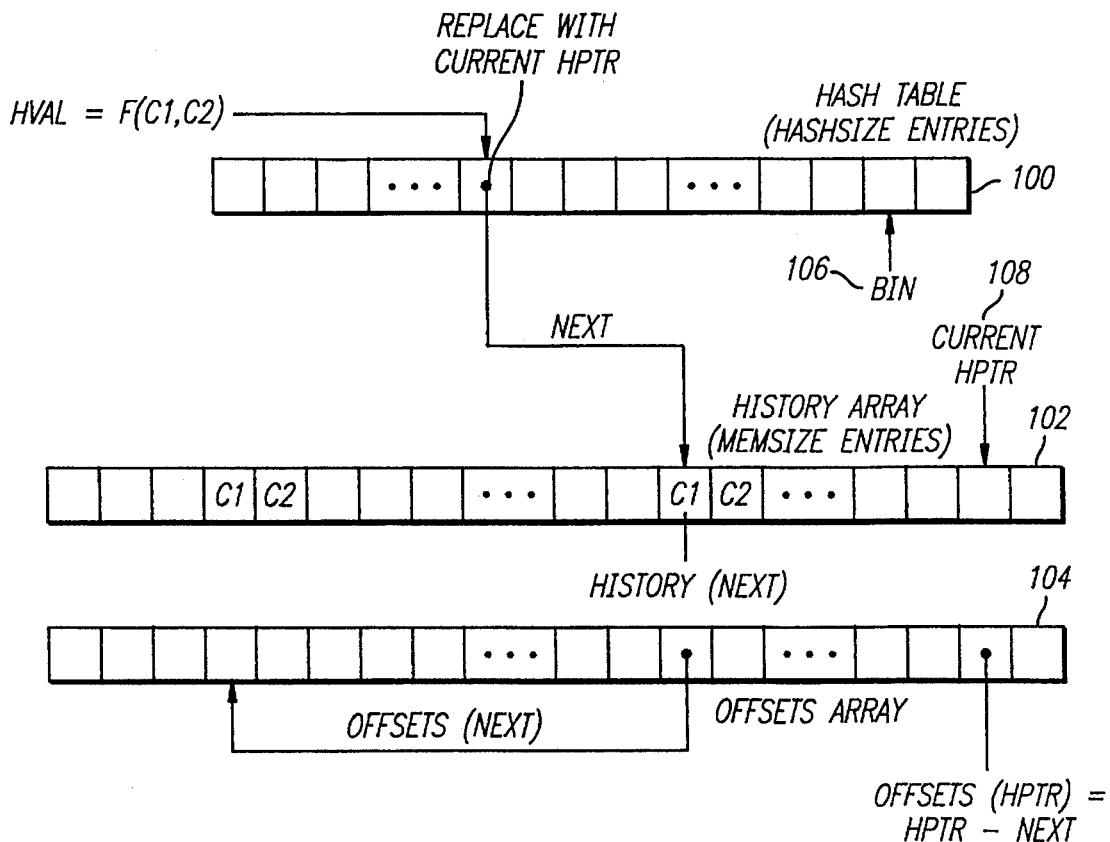
FIG. 3 depicts a simplified example of compression encodings according to the compression format depicted in FIG. 2.
FIG. 4 shows the data structures implemented by the preferred embodiment of invention for performing searches on the input data stream.

FIG. 3 shows a simple results table utilizing the compression scheme shown in FIG. 2. The table is separated into three columns, the first column 75 represents an input byte stream, the second column 77 is the encoded output stream, and the last column 79 provides comments. Each row of the encoded output bit stream is referenced 76–86. The basic operation for compressing the input byte stream 75 (ABAAAAAACABA) proceeds as follows. Compression is achieved by locating matching strings of bytes in the input byte stream 75. In the preferred embodiment, a hashing structure shown in FIG. 4 is utilized for performing an efficient hash search. A more detailed discussion of the structure shown in FIG. 4 and hash search will be presented shortly. In the preferred embodiment, compression occurs for byte streams which are two bytes or longer. When the first input byte is received by the compression unit 4 a search is performed to determine whether there were any other 2-byte strings in history which match the first input byte. The first input byte is character "A" (76, FIG. 3) which has no prior history and, thus, this first byte is appended to the encoded output stream after a tag bit of "0" to indicate that the 8-bit byte is "raw" (or not compressed) as shown at (76, (FIG. 3).

The next input byte in the input byte stream is a "B" character. So far, the only other byte in the byte stream is non-matching (the history has "A") and, thus, the byte for character "B" and a "raw" byte indicator are output as shown at 78, 77 (FIG. 3). The next input byte in the input stream 75 is character "A". Because in the preferred embodiment only strings having two or more bytes are compressed, the byte for character A is left uncompressed and it is output as a raw data byte as shown at 80 (FIG. 3). However, when the next input byte (character "A") is encountered, a 2-byte string is found. Compression unit 4 lends a match of length 2 and mode compares the next bytes of the input byte stream. Because the next input byte matches the prior bytes (e.g. character "A"), the match length is incremented and the string match is "extended". This process continues for the next 4 input bytes having character "A". As shown at row 82, FIG. 3, the encoded version of the bit string (AAAAAA) is "11 0000001 1100". The first bit of the encoded string is a 1 indicating the compressed encoding mode. The next bit in the bit string indicates that the short form of the offset is utilized (23, FIG. 2). The offset is 0000001 indicating an offset of 1 byte and the length as shown in Table 25 (FIG. 2) for "1100" is 5 bytes. The rest of the bytes in the input byte stream 75 are encoded using the same strategy as discussed above.

In the above example, if a byte did not match, then compression unit 4 would have continued to search back through the history of the input byte stream for a string that matched up to and included the current input byte. If such a new string was found, the match length would be incremented and the position of the new matching string would be determined and saved; this string match has thus been "extended". If such a new string is not found, or if too many prior input byte entries have to be searched, the current matching string is assumed to be the maximal string and in its encoded form or raw byte form it is output. In the encoded form, its length and relative position within the history storing the input byte stream are appended to the output (compressed) data stream. The offset is computed as the number of bytes from the start of the string to the matched byte in the buffer, which ranges in the preferred embodiment from 1 to the memory size ("MEMSIZE")–1.

As stated above, length and offsets are encoded as shown in FIG. 2. Note that, in contrast to the approaches discussed in the background section of this application, the compression method of the preferred embodiment results in variable length strings mapped to variable length output codes.

Those skilled in the art will recognize that there are many implementations for performing string search operations on the input byte stream. In particular, there are many hashing techniques and search methods that could be used to find matching strings. for a complete background on various hashing techniques, refer to Knuth, Sorting and Searching, The Art of Computer Programming (Vol. 3) pp. 506–549 (1973), which is herein incorporated by reference. Below is a more detailed description of the particular hashing structure utilized by the preferred embodiment. The data structure and approach to be discussed have been selected because they minimize the number of RAM-cycles required for the compression function, thus maximizing the system throughput.

Referring now to FIG. 4, the preferred embodiment of the hash structure is now discussed. A history array 102 containing the last 2048 characters of previously processed input data (which has already been compressed or which is uncompressed as raw data) is stored in RAM 16 (FIG. 1a). When new input data is received by the compression unit 4 (FIG. 1a), the present invention checks to see if a "string" of at least 2 bytes in the new input data matches the string in the history array 102. If so, this string of input data is encoded or, if it is not, it is represented as raw data as described above.

A hash table 100 is utilized to quickly find specified strings in the history array 102. The hash table 100 is made up of a series of bin entries which contain history array pointers in to the history array. Another data structure called the offset array 104 is a hash link table. The first item in each linked list in the offset array 104 points to the previous entry in the history array which corresponds to a particular hash value, and the last item (which may be an invalid pointer) in the linked list points to the oldest entry associated with this hash value. The compression unit 4 maintains a 16-bit history pointer HPTR 108 which is incremented after each input byte is processed. HPTR is initialized to 0 and wraps back to 0 after 64K bytes have been processed by the compression unit. The offset array 104 is actually a secondary hash which consists of a singly linked list. If a particular offset is greater than MEMSIZE—MAXSTR (where MAXSTR is the maximum string being searched) or if the sum of all the links from the most recent entry of the list is greater than MEMSIZE-MAXSTR, then there are no further valid entries in the particular hash bin (value). In this way, the entries older than MEMSIZE—MAXSTR effectively "fall off" the end of the history array 102. This aspect of the present invention allows use of a singly linked list in the offset array 104, which can be maintained with less than half the memory accesses compared to a doubly linked list. Use of the singly linked list, however, necessitates a hash refresh operation which is discussed below.

Figure 5B:
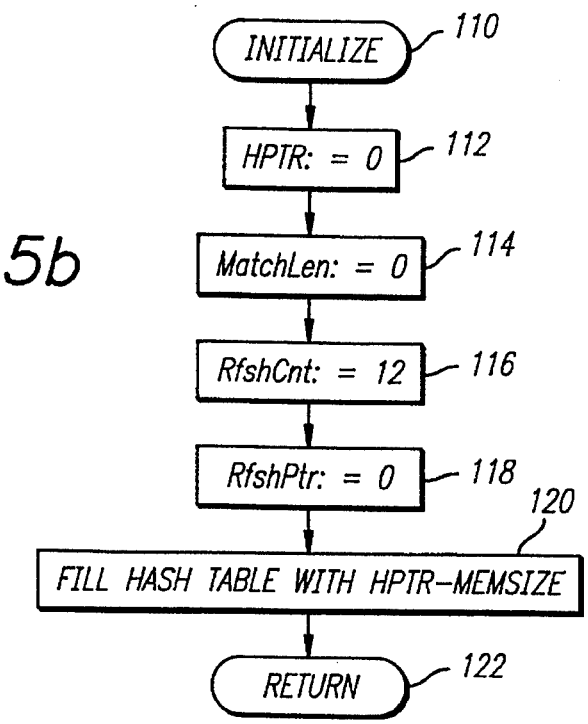
FIG. 5b is a flow block diagram of the INITIALIZATION Routine referenced during the COMPRESSION OPERATION Routine (FIG. 5a) for initializing the hash table of the data structures shown in FIG. 4.
Figure 5C:
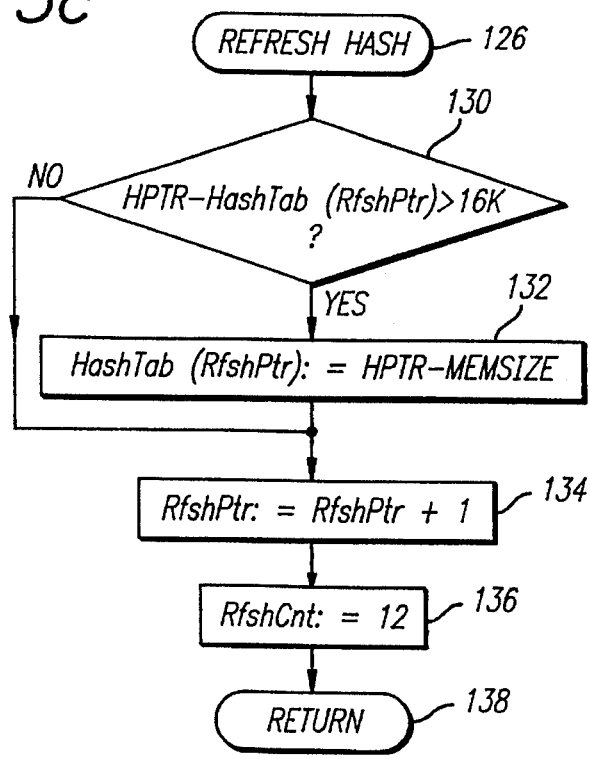
FIG. 5c is a flow block diagram of the REFRESH HASH Routine referenced during the COMPRESSION OPERATION Routine (FIG. 5a) for partially reinitializing the hash table of the data structures shown in FIG. 4.

Referring now to FIGS. 5a, 5b and 5c, a detailed flow diagram of the compression operation of the present invention is now discussed. A hard-wired version showing the particular data path of the flow diagram (FIGS. 5a, 5b and 5c) is shown in FIG. 7.

More particularly, referring to FIG. 5a, the COMPRESSION OPERATION Routine starts at block 108. Then, at block 110, the INITIALIZE Routine (FIG. 5b) is called to initialize the hash structure shown in FIG. 4. This operation is typically performed during system initialization and it does not have to be repeated, even if one "compression" has been completed and a new one is begun.

Referring to FIG. 5b at block 112, the hash pointer 108 (HPTR) is set equal to 0. At block 114 (FIG. 5b), a match length variable ("MATCHLEN") for keeping track of the current length of the presently encoded bit string is set to 0. Then, at block 116, a refresh count variable ("RFSHCNT") (to be discussed further) is set equal to 12. At block 118, a refresh pointer variable ("RFSHPTR") (to be discussed further) is set to 0. Then, during block 120, the hash table 100 is filled with the value HPTR-MEMSIZE. This step effectively empties the hash table 100 of all prior valid values. Because hash table 100 is very large, requiring such an initialization process (FIG. 5b) each time a new input data stream is presented with involved unacceptable latency in most systems. Therefore, a HASH REFRESH Routine (FIG. 5c) is utilized to distribute the cost of initialization over the entire period of the compression, thus minimizing the latency between compression operations.

Referring back to FIG. 5a, after the INITIALIZE Routine (FIG. 5b) has been completed, the compression unit 4 (FIG. 1a) can begin to accept bytes from the incoming data stream. At block 124, the variable REFSHCNT is checked to determine if it is equal to 0. If REFSHCNT has been decremented to be 0, then processing continues at block 126. During block 126, the REFRESH HASH Routine (FIG. 5c) is performed.

The purpose for the HASH REFRESH Routine (FIG. 5c) is for accounting for the eventual situation when the HPTR wraps back to an old valve in a particular bin of the hash table 100. When this occurs, that hash bin 106 within the hash table 100, which is actually very old, suddenly appears to be very new. The HASH REFRESH Routine (FIG. 5c) is responsible for periodically examining each entry (HASH TABLE (j)) in the hash table 100 to determine if the entry is too old; e.g., if HPTR-HASHTABLE(j)>OLDHASH, where OLDHASH is an appropriately chosen value such as 16K. If the entry is too old, then HASHTABLE(j) is replaced with HPTR-MEMSIZE. This value is old enough to be treated as an invalid or "NIL" pointer, but it allows up to 64K—MEMSIZE more bytes to be processed without HPTR wrap problems. The rate in which the hash table 100 is refreshed is computed as follows. The goal is to ensure that all hash table bins are examined at least once every 64K—OLDHASH bytes. This goal is achieved by performing a single hash refresh every (64K—OLDHASH)/HASHSIZE input bytes, where HASHSIZE is the number of bins within the hash table 100. In the preferred embodiment, this value is 48K/4K=12, so, for every 12th input byte, a single hash entry in the hash table 100 is refreshed.

Note that a refresh operation always involves one memory cycle, but if the bin entry needs to be updated, it will require a second (write) cycle. Increasing OLDHASH also increases the refresh rate, but the probability of a second memory circle decreases since it is more likely that the bin entry will have been updated by a string hashing into it. The value of OLDHASH=16K has been empirically found to provide a reasonable refresh overhead in the preferred embodiment. The refresh overhead per byte of input data is thus somewhat between 1/12 and 2/12 memory cycles, more than an order of magnitude less than the overhead for maintaining a doubly linked list.

In order to terminate a compression operation or start up a new one with a new input byte stream, the compression unit simply increments HPTR by MEMSIZE, and the bins of the hash table are automatically invalidated. Additionally, the refresh unit also needs to perform MEMSIZE/12 refresh cycles to make up for the refresh cycles missed during the MEMSIZE bytes that were never actually processed. However, this operation involves only 171 refresh operations instead of 4,096, and thus can be performed very quickly. In other compression methods, all tables and buffers typically need to be cleared before starting a new compression operation, which may require considerable latency.

Referring to FIG. 5c processing continues at block 130, where a determination is made as to whether HPTR—HASHTABLE [REFSHPTR]>16K. As stated earlier, this operation determines whether the current entry is too old. If the entry is too old, then processing continues at block 132 during which HASHTAB (RFSHPTR) is set equal to HPTR—MEMSIZE, which effectively creates an invalid value at this entry location. Returning to block 130, if it is determined that the entry is not too old, the processing continues at block 134. Regardless of whether the entry is too old or not too old, processing continues at block 134, during which the RFSHPTR is incremented by 1. Then, at block 136, RFSHCNT is set equal to 12 and processing returns to the COMPRESSION OPERATION Routine at block 128 (FIG. 5a).

Regardless of whether RFSHCNT is determined to be equal to 0 (requiring a call to the REFRESH HASH Routine, FIG. 5c) or not equal to 0 at block 124, processing continues at block 128. During block 128, the compression unit 4 (FIG. 1a) fills the first two bytes of the history array 102 with input data in order to initialize the operation. The two bytes are held in registers INREG0 and INREG1. Each time a new byte is processed, the hash ("H") of the first byte and the next input byte are computed. In the preferred embodiment, the hash is computed by shifting INREG0 left 4 bits and XORing it with INREG1. As discussed above, any of the hashing functions as discussed by Knuth (reference above) would be acceptable. As each new incoming byte is processed, the contents of INREG1 is moved to INREG0 and INREG1 is loaded with the new byte value.

For each byte processed at block 128, the hash value H ("H") is computed and the old entry within the hash value bin corresponding to the new hash value is read and saved in a variable called NEXT. Also, at block 128, the old entry in the hash table bin corresponding to the current hash value is replaced by the current value for HPTR. At block 140, a determination is made as to whether HPTR—NEXT>= MEMSIZE—MAXSTR is made. The variable MAXSTR is the value of the maximum string size being searched which ensures that the matching string of bytes found in the history array 102 is not overwritten by the currently processed bytes. Assuming that the determination results in a value greater than or equal to MEMSIZE—MAXSTR, then processing continues at block 142, during which the variable NEXT is set equal to HPTR—MEMSIZE. Stated differently, the hash bin is emptied because there were no matching strings within the last MEMSIZE bytes of history.

Regardless of whether the determination results in the value greater than or equal to MEMSIZE—MAXSTR, processing continues at block 144. During block 144, the value HPTR—NEXT is written into the corresponding offset array 104 entry at OFFSET(HPTR). Also, at block 144, the value of INREG1 is placed into the history array 102 entry at HISTORY(HPTR). The steps performed at blocks 124, 126, 128, 140, 142 and 144 discussed above complete the data structure maintenance required for the currently processed byte, and at this point a string search of the contents of history array 102 can begin. Note that the above housekeeping functions are performed for all input bytes processed, regardless of whether the compression unit is currently processing a string match.

At block 146, a determination is made as to whether the match length variable MATCHLEN is equal to 0. Recall that at block 114 of the INITIALIZE Routine (FIG. 5b) the MATCHLEN variable was set equal to 0. MATCHLEN contains the current string match length which, at the beginning of the operation, is 0. Assuming that we are processing at the beginning of the compression operation and that MATCHLEN is equal to 0, then an internal hash counter HASHCNT is set to 0. HASHCNT is used to limit the iterations of any particular string search. Then, at block 150, a determination is made as to whether HPTR—NEXT>=MEMSIZE—MAXSTR. Assuming that the resulting value is less than MEMSIZE—MAXSTR, processing continues at block 152. During block 152, a determination is made as to whether the value for the variable INREG1 is equal to the value in the history array at HISTORY(NEXT). The purpose of this step is to search to the prior entry in the history array for a 2-byte string that matches the 2 bytes in INREG0 and INREG1. Only the value within INREG1 is compared to the value at HISTORY(NEXT) because the hash function is chosen to be a 1 to 1 mapping with respect to INREG0, so that only one byte from each string in the hash list has to be compared with INREG1. This step increases the performance of the present embodiment because a 1-byte comparison instead of a 2-byte comparison only needs to be performed. Returning to block 150, if the value determined is greater than or equal to MEMSIZE—MAXSTR, then processing continues at block 158. During block 158, the raw data tag and the raw data byte in INREG0 is output and processing continues to block 125. At block 125 the next input byte is obtained and the process starts all over again.

Returning to block 152, if the determination results in a match, then processing continues at block 160 during which the variable MATCHPTR is set equal to the value of the variable NEXT. Additionally, the variable MATCHLEN is set equal to 2 to signify a two byte match and processing continues at block 125 during which the next input byte is obtained. However, assuming that the value at HISTORY(NEXT) is not matched, then processing continues at block 154 during which the value of HASHCNT is incremented and the variable NEXT is set equal to NEXT-OFFSET(NEXT). This step effectively points to the next entry linked by the offset array 104. Processing continues at block 156 during which a determination is made as to whether HASHCNT reaches a predetermined maximum count value MAXHCNT (typically 8). If HASHCNT is greater than or equal to MAXHCNT, then processing continues at block 158 during which the output raw byte INREG0 is output and processing continues at block 125. However, if HASHCNT is not greater than or equal to MAXHCNT, then processing continues at blocks 150, 152, 154 and 156 until HASHCNT reaches MAXHCNT or until there are no more valid entries in the hash list (as determined at block 150) or until a matching string is found (at block 152).

Eventually, processing continues at block 125, and at this time, the compression unit 4 (FIG. 1b) is ready to process a new input data byte. At block 125, HPTR is incremented and the variable RFSHCNT is decremented. Processing continues at blocks 124, 126, 128, 140, 142, 144, 146, 148, 150, 152, 154, 156, 158, 160 and 125 until MATCHLEN is determined to be greater than 0 at block 146. Referring to block 146, note that when MATCHLEN is not equal to 0, processing continues at block 162. During block 162, the variable MATCHPTR is incremented by 1. In this way, the new value INREG1 will be compared against the next byte in the stream of MATCHLEN plus 1 found at MATCHPTR in the history array 102. At block 164, the determination is made on whether the bytes match. If the bytes match, then MATCHLEN is incremented and the string is extended at block 180 and processing then continues at block 125. However, if the bytes do not match, then processing continues at block 166 during which the variable NEXT is set equal to MATCHPTR—MATCHLEN+1. Processing continues at block 168, during which the variable NEXT is set equal to NEXT—OFFSET(NEXT). In addition, at block 168, the variable HASHCNT is incremented. Steps 166 and 168 effectively cause the compression unit 4 (FIG. 1a) to search to the successive string entry remaining in the hash bin for the original string being matched. At block 170, a determination is made on whether HPTR—NEXT>=MEMSIZE—MAXSTR. If the value determined is greater than MEMSIZE-MAXSTR, then there are no more valid entries and processing continues at block 182. At block 184, MATCHLEN is set to 0 and processing begins over with a new byte at block 125. However, if the value determined at block 170 is less than MEMSIZE—MAXSTR, then processing continues at block 172 during which a determination as to whether MATCHLEN>=MAXSTR is made. Assuming that MATCHLEN>=MAXSTR, then an invalid search has occurred and processing continues at block 182. However, assuming that MATCHLEN is not greater than or equal to MAXSTR, then processing continues at block 174. At block 182 the compression unit 4 (FIG. 1a) outputs a string record consisting of a tag bit ("1") which indicates that a matching string has been found, followed by the appropriately encoded offset (OFFSET=HPTR—MATCHPTR) of the match string in history array 102, and the encoded length.

At block 174, a determination is made as to whether the current string of length MATCHLEN+1 at location HISTORY (NEXT) is equal to the contents of the internal match buffer. The internal match buffer contains all MATCHLEN bytes of the currently matching string. This buffer allows faster searching for a new string if the initial attempt to match this string fails. An efficiency occurs because the bytes to be matched are immediately available within the chip instead of having to reach them from RAM each time a match is performed. Stated differently, the matching buffer acts as a look aside buffer to efficiently enhance processing. The match buffer is of finite length (MAXSTR=8 bytes in the preferred embodiment).

If the string of MATCHLEN+1 at HISTORY (NEXT) equals the contents of the match buffer, then processing continues at block 178 during which the variable MATCHPTR is set equal to NEXT+MATCHLEN. Processing continues at block 180 during which MATCHLEN is incremented and processing continues at block 125 during which the next new byte in the input data stream is processed. However, if the string at HISTORY (NEXT) is not equal to match buffer, then processing continues at block 176, during which a determination is made as to whether the variable HASHCNT is greater than or equal to MAXCNT. If HASHCNT is greater than or equal to MAXHCNT, then processing continues at blocks 182 and 184 during which an encoded string having a tag bit of "1" followed by the appropriate encoded offset of the match in the history array and the encoded length are output and the variable MATCHLEN is set equal to 0. Processing continues at block 125 during which the next new input data byte is processed. Returning to block 176, however, if HASHCNT is not greater than or equal to MAXHCNT, then processing continues at blocks 168, 170, 172, 174 and 176 until a match length of MATCHLEN+1 is found, or until HASHCNT reaches MAXHCNT or until there are no more valid hash entries (HPTR—NEXT>=MEMSIZE—MAXSTR).

In the preferred embodiment, the above operations are pipelined to ensure that the RAM 16 (FIG. 1a) is busy on every clock cycle, since the RAM cycle count is the limiting factor on performance.

Typically, in a storage system, the data must be blocked into sectors or blocks of a fixed size, and it is often desireable to truncate the compression at a given stage and then restart a new operation on the remaining input stream. In the preferred embodiment, a count of compressed bytes output is maintained. When this count reaches a predetermined (user selectable) value, or when the input data stream is exhausted, the compression unit is told to "flush" the compression, meaning to complete compression of the bytes in INREG0 and INREG1, terminate and output the string currently being extended (if any) or to output the remaining unprocessed byte(s) as raw bytes, without taking any new bytes from the input FIFO.

The compression unit then outputs a special "end of compressed data" marker, which is a string with an offset of zero. This offset could be interpreted as an offset of MEMSIZE, but instead it is reserved to mean that this is the end of this compression operation. In fact, in the preferred embodiment, all offsets in the range MEMSIZE—MAXSTR (where MAXSTR is typically 8) to MEMSIZE−1 (and zero) are reserved, so no strings will be found past this offset into history. This feature allows for future extensions to the format, and it also avoids some difficult problems involving wrapping in the history buffer. After a flush, the compression unit adds MEMSIZE to HPTR, performs the appropriate number (MEMSIZE/12) of hash refresh cycles, and then begins a new compression operation.

Extensive software simulation of the compression method was performed during the development of the present invention. Various values of all the parameters, including MAXHCNT, HASHSIZE, match buffer size, and MEMSIZE, were tested to determine their impact on throughput and compression ratio. The particular format and set of parameters in the preferred embodiment was selected as having an acceptance tradeoff on these performance issues. However, many similar sets of parameters and encodings result in substantially similar performance.

The decompression unit 6 (FIG. 1b), by comparison with the compression unit 4 (FIG. 1a), is very simple. It receives an encoded stream of bytes and converts this stream into a bit stream, which is constructed according to the encoding scheme shown in FIG. 2. For each raw byte or encoded byte stream output, the byte is transferred into a decompression output FIFO, and it is also appended to a decompression history array which is maintained in RAM 16 (FIG. 1b). The decompression history array is identical to the history array as shown at 102 in FIG. 4. The decompression unit 6 (FIG. 1b) also contains a current history pointer ("DPTR"), which is incremented for each byte output and wraps back to zero when it reaches MEMSIZE. When an encoded string is parsed, the offset from the string is subtracted from DPTR, and a string of bytes of the encoded length is output, starting at the offset location within the decompression history array. Thus, the decompression unit 6 (FIG. 1b) does not have to maintain any hash structures as shown in FIG. 4 (i.e. hash table 100 and offset aray 104 (FIG. 4)) and in fact requires only MEMSIZE bytes of RAM 16 (FIG. 1b).

Typically there is enough RAM 16 (FIG. 1b) to maintain separate compression and decompression data structures, enabling both compression and decompression operations simultaneously, but in the preferred embodiment this ability is not implemented.

Figure 6:
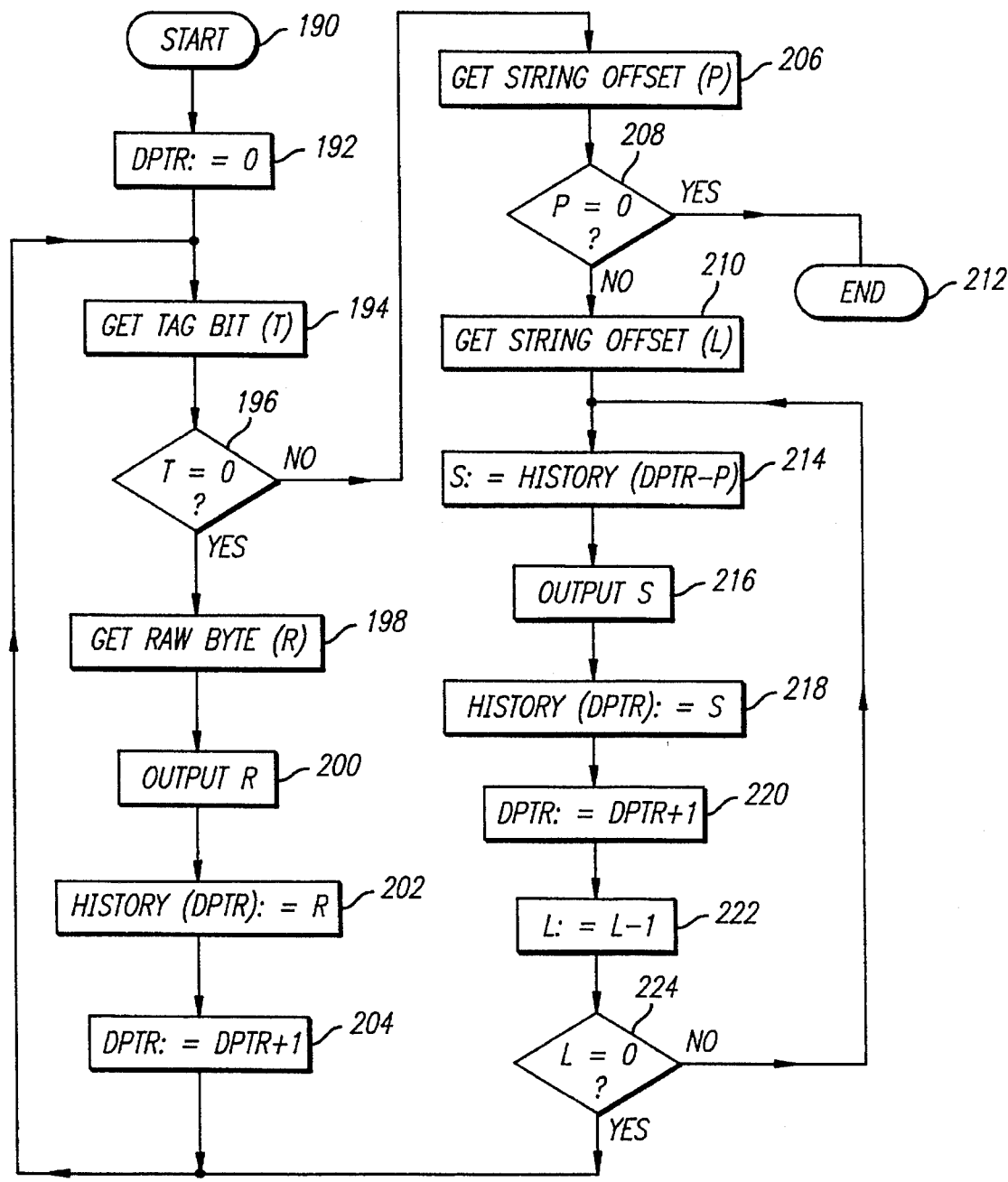
FIG. 6 is a flow block diagram of the DECOMPRESSION OPERATION Routine.

Referring to FIG. 6, a detailed block diagram of the DECOMPRESSION OPERATION Routine for performing decompression is shown. The input to the DECOMPRESSION OPERATION Routine (FIG. 6) is as encoded byte stream output by any compression operation (i.e. COMPRESSION OPERATION (FIG. 5A, B, and C)). At block 190, the operation begins and at block 192 the pointer DPTR is set to 0. Processing continues at block 194 during which the tag bit is parsed from the input encoded data stream. Then, during block 196, a determination is made as to whether the tag bit is equal to 1 or 0. Recall that a tag bit of "1" signifies that an encoded compressed bit string follows and that a tag bit of "0" signifies that the output byte is uncompressed "raw" data. Assuming that the tag bit is equal to 0, processing continues at block 198. During block 198, the "raw" byte is parsed from the input encoded data stream. Then, during block 200, the raw data byte is output and at block 202, the raw data byte is stored in the decompression history array at HISTORY(DPTR). Processing continues at block 204 during which the DPTR is incremented to the next output byte. Processing returns to blocks 194, 196, 198, 200, 202, and 204 for processing raw data bytes.

Returning to block 196, if the output byte encountered has a tag bit of 1, then processing continues at block 206. At block 206, the parsing of the encoded bit string begins. More particularly, at block 206 the offset ("P") value in the encoded string is parsed from the input encoded data stream. At block 208, a determination is made as to whether the offset value P is equal to 0. An offset value of 0 indicate the end marker which signifies the end of the encoded output data stream as stated earlier. If the offset is equal to 0, processing continues at block 212 during which processing returns to the calling program. However, if the offset is greater than 0, then processing continues at block 210.

During block 210, the length of the bit string is parsed from the input encoded data stream. At block 214, the contents of the decompression history array at HISTORY(DPTR—P) is determined. Then during block 216, the data stored at this location is output. At block 218, the data is stored at HISTORY(DPTR). Then at block 220, DPTR is incremented and at block 222 the length of the bit string is decremented. During block 224, a determination is made as to whether the length has been decremented to 0. If the length has not been decremented to 0, then processing continues at blocks 214, 216, 218, 220, 222, and 224 until all of the bytes in the encoded byte stream have been output.

Once the length has been decremented to 0, processing continues at block 194 during which the next tag bit is parsed from the input encoded data stream. Thus, processing continues until an encoded byte string is encountered having an offset of 0 as determined at block 208, at which time processing returns to the calling program at block 212.

Referring to FIG. 7, a circuit diagram 228 which incorporates the preferred embodiment of the data compression unit 4 (FIG. 1a) is shown. The elements of circuit 228 are implemented by digital logic. Circuit 228 is controlled by compression controller and sequence unit 230. Compression control and sequence unit 230 is linked to each of the components of circuit 228 by a series of control lines not shown. An internal clock (not shown), which in the preferred embodiment operates at several megahertz/second, determines the activity level of the control and sequencing unit 228, which may affect the operation of one or more of the components during any clock cycle of operation. The actual operations and their sequence are depicted in FIGS. 5a, 5b and 5c which were discussed earlier.

The preferred embodiment includes two FIFOs 232 and 234 which are implemented as registers within the integrated circuit, to facilitate data movement and packing. One of the FIFOs (selectable by the user) can also "spill over" into a reserved portion of the RAM 240 (FIG. 8). Typically this reserved portion is 8K or 16K bytes. Utilizing a portion of the compression RAM in this fashion allows for distinct performance advantages, particularly in systems utilizing the small systems computer interface (SCSI), in which multiple computers and devices share a single bus for commands and data.

In SCSI, it is very desirable to get on and off the bus as quickly as possible, transmitting data very rapidly so as not to impede other bus traffic. SCSI transfer rates of up to 5 Mbytes/second are achievable. However, the compression unit throughput is usually considerably less than this figure, so transferring compressed data to the SCSI bus "on the fly" could be unacceptable from a performance standpoint.

To avoid this problem, the external RAM FIFO 240 (FIG. 8) is selected to be on the output side 238 (FIG. 7) of the compression unit 4 (FIG. 1a). The external Ram FIFO 240 is controlled by a RAM FIFO control 242 located within the compression unit 4 (FIG. 1a). The RAM FIFO 240 is used both for compression computations (history, hash, etc) and for FIFOing. Once the RAM FIFO 240 has accumulated enough data to allow a SCSI block transfer, a counter inside the chip interrupts the controlling microprocessor which initiates the SCSI transfer. This transfer then proceeds at the full SCSI bandwidth, even though the buffer (which may continue to fill) was filled at lower speed.

This dual use of the RAM, which is commonly available in RAM sizes large enough to accommodate both compression data structures and FIFOs, greatly enhances the performance of the system. The RAM FIFO 240 (FIG. 8) can also be placed on the other side of the data flow (typically in an embedded drive controller), or it can be used during decompression to achieve the same goal. In general, the RAM FIFO is chosen to be on the SCSI (or highest speed) side of the operation.

A more detailed discussion of the data flow within the circuit 228 is now presented. Uncompressed bytes in an input byte stream are input into the compression unit 4 over line 244 to the input FIFO 232. Bytes stored in the input FIFO are then transferred to two extension FIFO registers INREG1 233 and INREG0 235. More particularly, the data from FIFO 232 is linked to the INREG1 register 233 over line 246. The data stored in INREG1 233 can then be transferred via lines 248 and 250 to INREG0 235. Recall that the purpose of the INREG1 and INREG0 registers were for producing the input to the hashing function (237). The contents of INREG1 233 is output via line 248 to line 252 and input to the hash function 237. Likewise, the contents of INREG0 235 is output over line 251 and then over line 253 to the hash function 237. The output of the hash function 237 is sent via line 255 to the multiplexer 256.

Returning to INREG1 233, if no matching string is found, then it will be sent over lines 248, 254, and 258 to the output manager 260. The purpose of the output manager 260 is for encoding raw data bytes and strings into bit strings with the appropriate tags, etc. The output of the output manager 260 is then sent via line 262 to a bit to byte converter 264. Then the data is input to the output FIFO 234 via line 268. The compressed bytes are output from the output FIFO 234 via line 270 to the output device (14, FIG. 1a).

The contents of INREG1 233 are also sent via lines 248, 254 and 272 to internal match buffer 274. The purpose of the internal match buffer 274 is for acting as a "lookaside" buffer to efficiently enhance the matching process. The contents of the match buffer 274 are then compared to the contents at the byte comparison register 276. The contents of the match buffer are multiplexed over line 278 to the byte comparison register 276. The contents of the byte comparison register 276 are obtained from the history array 102 (FIG. 4) stored out in RAM 238. The contents of the history array entry are input via line 280 to latch 282 and then over lines 284 and 286 to the byte comparison register 276. The results of the byte comparisons performed at block 276 are sent via line 288 to the control and sequence unit 230. The control and sequence unit 230 evaluates the comparison results and sends out the appropriate control signals to the various components of the circuit 228 via control lines (not shown).

Returning to INREG0 235, its contents can also be sent via lines 251 and 290 to multiplexer 292. Multiplexer 292 then arbitrates and sends the contents of INREG0 via line 294 to latch 296. The contents of latch 296 are then output via line 298 to the history array 102 (FIG. 4) of the data structure in the RAM 238.

Data input from the RAM 238 over line 280 may also be sent via latch 282 and lines 284, 300 and 302 to register 304. Data over this path would consist of an old hash pointer stored in a variable called NEXT. The contents of register 304 can then be output via lines 305, 306 and 307 to multiplexer 256. The output of register 304 is also tied to an offset register 310 via lines 305 and 308. The operation the function performed at 310 will be discussed shortly. The contents of register 304 may also be sent via lines 304, 305, 306 and 312 to register 314 containing the variable contents for MATCHPTR. The output of register 314 (MATCHPTR) is sent via line 316 to multiplexer 256. The purpose of register 318 is for incrementing the pointer HPTR. The output of register 318 is sent via lines 320 and 322 to the multiplexer 256. In the alternative, the output of register 318 may also be sent via lines 320 and 324 to the offset register 310. The purpose of the offset function is for calculating the appropriate offset in the history array or HPTR—NEXT as input over lines 324 and 308 from the registers 318 and 304.

A modify switch 328 may be applied over line 330 to the offset register 310 to force the offset function to only output the current HPTR input over line 324. When the modified switch 328 is set such that the offset function is determined, the output of offset function 310 is sent either to multiplexer 292 or to the output bit manager 260. When the output is sent to the output bit manager 260 it is sent via lines 332 and 336. The offset is then encoded into the encoded string at the output bit manager 260. Alternatively, the output is sent to multiplexer 292 via lines 332 and 334 and then output over lines 294 to latch 296 and to the RAM 238 via line 298. However, if the modify switch 328 is set such that the output of the offset register 310 is the current HPTR, then the output is sent via lines 332 and 334 to multiplexer 292 which arbitrates the output over line 294.

The length input to the output bit manager 260 for encoding purposes is maintained by register 338 shown at the bottom of the circuit diagram 228. The output of the register 338 is linked to the output manager 260 via line 340. At the top of the circuit diagram 228, a refresh counter 342 is shown which maintains the current cycle count before the refresh operation is performed. The output of the refresh count is sent via line 344 to multiplexer 256. The purpose of multiplexer 256 is for arbitrating which address over lines 344, 316, 322, 307 and 255 is output in order to select the appropriate data structures in the RAM 238.

The invention has been described in an exemplary and preferred embodiment, but is not limited thereto. Those skilled in the art will recognize that a number of additional modifications and improvements can be made to the invention without departure from the essential spirit and scope. The scope of the invention should only limited by the appended set of claims.

We Claim:

1. A method for converting an input data stream into an encoded data character stream, said data stream including data characters, said method comprising the steps of:

storing data characters into a data storage means for reference, performing a search in said data storage means for a data character string of said stored data characters which match said input data stream, and encoding a length and an offset position within said data storage means of one of said matching strings found by said search in said data storage means, wherein said offset position is encoded with a tag bit indicating either a short or a long offset, and with a predetermined number of bits indicating the location within said data storage means where said matching string is located.

2. The method of claim 1, wherein said step of encoding said offset position further comprises:

indicating a short offset with said tag bit having value "1," and indicating a long offset with said tag bit having value "0."

3. The method of claim 1, wherein said step of encoding said offset position further comprises:

operative when said tag bit indicates a short offset, indicating the location within said data storage means where said matching string is located with seven bits, and operative when said tag bit indicates a long offset, indicating the location within said data storage means where said matching string is located with eleven bits.

4. An apparatus for converting an input data stream into an encoded data character stream, said data stream including data characters, said apparatus comprising:

means for storing data characters for reference, means for performing a search in said storing means for a data character string of said stored data characters which match said input data stream, and means for encoding a length and an offset position within said storing means of one of said matching strings found by said search in said storing means, wherein said offset position is encoded with a tag bit indicating either a short or a long offset, and with a predetermined number of bits indicating the location within said storing means where said matching string is located.

5. The apparatus of claim 4, wherein said means for encoding said offset position further comprises:

means for indicating a short offset with said tag bit having value "1," and means for indicating a long offset with said tag bit having value "0."

6. The apparatus of claim 33, wherein said means for encoding said offset position further comprises:

means for indicating the location within said storing means where said matching string is located with seven bits, and means for indicating the location within said storing means where said matching string is located with eleven bits.

7. A method for converting an input data stream into a variable length encoded data character stream in a data compression system, said data stream including data characters, said data compression system comprising a storage means for storing input data characters of said input data character stream, said method comprising the steps of:

performing a search in said storage means for a data character string which matches said input data stream;

operative when said matching data character string is found within said storage means, encoding said matching data character string by assigning a tag indicating that said matching data character string was found, a variable length indicator of the length of said matching data character string, and a pointer indicating the location within said storage means of said matching data character string, and said step of encoding said matching data character string including the step of representing said pointer and said variable length indicator by an encoding scheme according to a predetermined strategy, said predetermined strategy ensuring that a matching data character string of two data characters of said input data character stream is compressed to less than said two data characters of said input data character stream;

operative when said matching input data character string is not found within said storage means, encoding a first character of said input data character stream by assigning a "raw" data tag indicating that no matching data character was found in said storage means and appending said first character of said input data character stream.

8. The method of claim 7 wherein said step of performing said search in said storage means for said matching data character string further includes the step of limiting said search to a predefined number of inquiries in said storage means for said matching data character string.

9. The method of claim 7 wherein said step of assigning said pointer indicating the location within said storage means of said matching data character string further includes the step of providing an indicator of the length of said pointer.

10. The method of claim 9 wherein said step of providing said indicator of the length of said pointer further includes the step of representing said pointer as either a long form or a short form pointer.

11. An apparatus for converting an input data stream into a variable length encoded data character stream, said data stream including data characters, said apparatus comprising:

a storage means for storing input data characters of said input data character stream;

means for performing a search in said storage means for a data character string which matches said input data stream;

means for encoding said matching data character string by assigning a tag indicating that said matching data character string was found, a variable length indicator of the length of said matching data character string, and a pointer indicating the location within said storage means of said matching data character string, said means for encoding said matching data character string including means for representing said pointer and said variable length indicator by an encoding scheme according to a predetermined strategy, said predetermined strategy ensuring that a matching data character string of two data characters of said input data character stream is compressed to less than said two data characters of said input data character stream;

means for encoding a first character of said input data character stream by assigning a "raw" data tag indicating that no matching data character was found in said storage means and appending said first character of said input data character stream.

12. The apparatus of claim 11 wherein said means for performing said search in said storage means for said matching data character string further includes means for limiting said search to a predefined number of inquiries in said storage means for said matching data character string.

13. The apparatus of claim 11 wherein said means for assigning said pointer indicating the location within said storage means of said matching data character string further includes means for providing an indicator of the length of said pointer.

14. The apparatus of claim 13 wherein said means for providing said indicator of the length of said pointer further includes means for representing said pointer as either a long form or a short form pointer.

* * * * *